(12) United States Patent
Fachmann et al.

(10) Patent No.: US 9,293,533 B2
(45) Date of Patent: Mar. 22, 2016

(54) SEMICONDUCTOR SWITCHING DEVICES WITH DIFFERENT LOCAL TRANSCONDUCTANCE

(71) Applicant: Infineon Technologies Austria AG, Villach (AT)

(72) Inventors: Christian Fachmann, Fuernitz (AT); Enrique Vecino Vazquez, Munich (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/310,055

(22) Filed: Jun. 20, 2014

(65) Prior Publication Data
US 2015/0372087 A1  Dec. 24, 2015

(51) Int. Cl.
| | |
|---|---|
| H01L 27/07 | (2006.01) |
| H01L 29/06 | (2006.01) |
| H01L 29/66 | (2006.01) |
| H01L 29/78 | (2006.01) |
| H01L 29/739 | (2006.01) |
| H01L 29/417 | (2006.01) |
| H01L 29/423 | (2006.01) |

(Continued)

(52) U.S. Cl.
CPC .......... *H01L 29/0696* (2013.01); *H01L 21/283* (2013.01); *H01L 27/07* (2013.01); *H01L 27/0705* (2013.01); *H01L 29/0634* (2013.01); *H01L 29/1095* (2013.01); *H01L 29/41741* (2013.01); *H01L 29/4232* (2013.01); *H01L 29/66333* (2013.01); *H01L 29/66666* (2013.01); *H01L 29/66712* (2013.01); *H01L 29/7395* (2013.01); *H01L 29/7811* (2013.01); *H01L 29/7827* (2013.01)

(58) Field of Classification Search
CPC .. H01L 27/07; H01L 27/0705; H01L 29/7811
USPC ........................................................ 257/203
See application file for complete search history.

(56) References Cited

U.S. PATENT DOCUMENTS

| | | | |
|---|---|---|---|
| 5,121,176 | A | 6/1992 | Quigg |
| 5,146,426 | A | 9/1992 | Mukherjee et al. |
| 5,451,807 | A | 9/1995 | Fujita |

(Continued)

FOREIGN PATENT DOCUMENTS

| | | |
|---|---|---|
| DE | 19808348 C1 | 6/1999 |
| DE | 10246960 A1 | 4/2004 |
| EP | 0293846 A1 | 12/1988 |

OTHER PUBLICATIONS

Sedra, Adel S. et al., "Microelectronic Circuits", Oxford University Press, 1982, pp. 356, 368-369.

*Primary Examiner* — Allan R Wilson
(74) *Attorney, Agent, or Firm* — Murphy, Bilak & Homiller, PLLC

(57) ABSTRACT

A semiconductor device includes a semiconductor substrate having an outer rim, a plurality of switchable cells defining an active area, and an edge termination region arranged between the switchable cells defining the active area and the outer rim. Each of the switchable cells includes a body region, a gate electrode structure and a source region. The active area defined by the switchable cells includes at least a first switchable region having a first transconductance and a second switchable region having a second transconductance which is different from the first transconductance.

26 Claims, 23 Drawing Sheets

(51) Int. Cl.
*H01L 29/10* (2006.01)
*H01L 21/283* (2006.01)

(56) References Cited

U.S. PATENT DOCUMENTS

| | | | |
|---|---|---|---|
| 6,097,214 A | 8/2000 | Troussel et al. | |
| 6,271,562 B1 | 8/2001 | Deboy et al. | |
| 6,653,691 B2 | 11/2003 | Baliga | |
| 6,872,990 B1 | 3/2005 | Kang | |
| 6,882,005 B2 | 4/2005 | Disney | |
| 6,924,532 B2 | 8/2005 | Pfirsch et al. | |
| 7,939,882 B2 | 5/2011 | Su et al. | |
| 8,680,610 B2 | 3/2014 | Hsieh | |
| 2001/0054760 A1 | 12/2001 | Ito et al. | |
| 2002/0056872 A1 | 5/2002 | Baliga | |
| 2002/0093033 A1* | 7/2002 | Zommer et al. | 257/202 |
| 2002/0168821 A1* | 11/2002 | Williams et al. | 438/268 |
| 2004/0113179 A1 | 6/2004 | Pfirsch et al. | |
| 2004/0232484 A1* | 11/2004 | Zommer et al. | 257/341 |
| 2004/0246219 A1 | 12/2004 | Moon | |
| 2008/0265289 A1* | 10/2008 | Bhalla et al. | 257/263 |
| 2009/0213148 A1 | 8/2009 | Takasugi | |
| 2010/0025748 A1 | 2/2010 | Mauder et al. | |
| 2011/0163373 A1* | 7/2011 | Arzumanyan et al. | 257/330 |
| 2013/0020635 A1 | 1/2013 | Yilmaz et al. | |
| 2013/0207101 A1 | 8/2013 | Yamazaki et al. | |
| 2013/0240955 A1 | 9/2013 | Hirler et al. | |
| 2013/0320487 A1 | 12/2013 | Mauder et al. | |
| 2013/0334597 A1 | 12/2013 | Yamashita et al. | |
| 2013/0341673 A1 | 12/2013 | Pfirsch et al. | |
| 2013/0341674 A1 | 12/2013 | Werber et al. | |
| 2014/0015592 A1 | 1/2014 | Weis | |
| 2014/0197477 A1* | 7/2014 | Onishi | 257/329 |
| 2014/0374882 A1 | 12/2014 | Siemieniec et al. | |
| 2015/0001549 A1 | 1/2015 | Miura et al. | |
| 2015/0115286 A1 | 4/2015 | Takeuchi et al. | |
| 2015/0162407 A1 | 6/2015 | Laven et al. | |

* cited by examiner

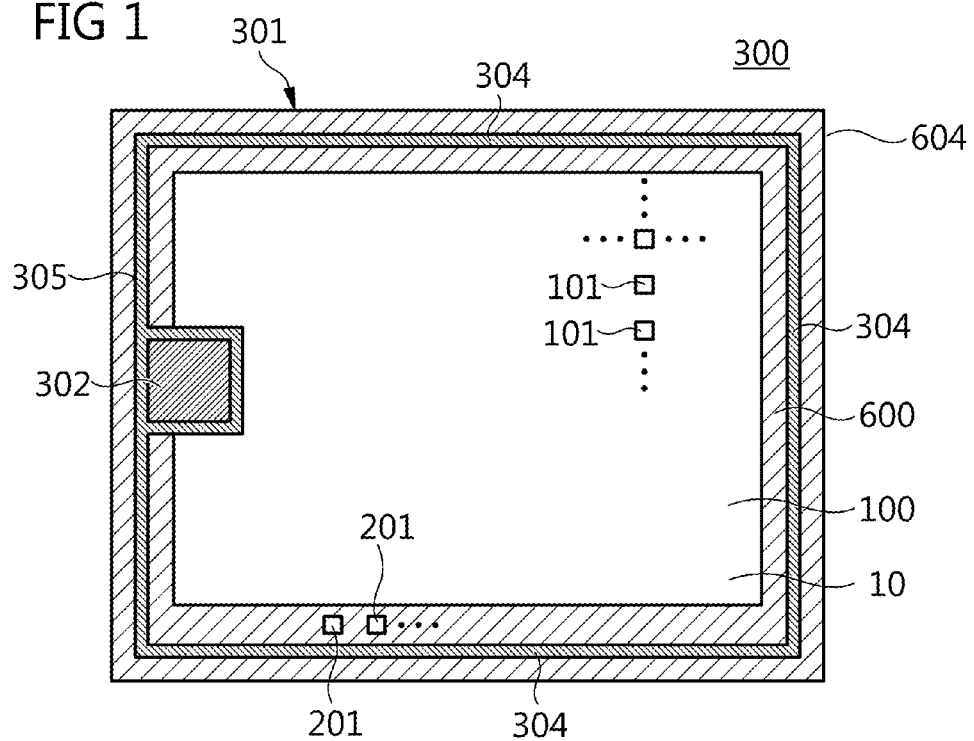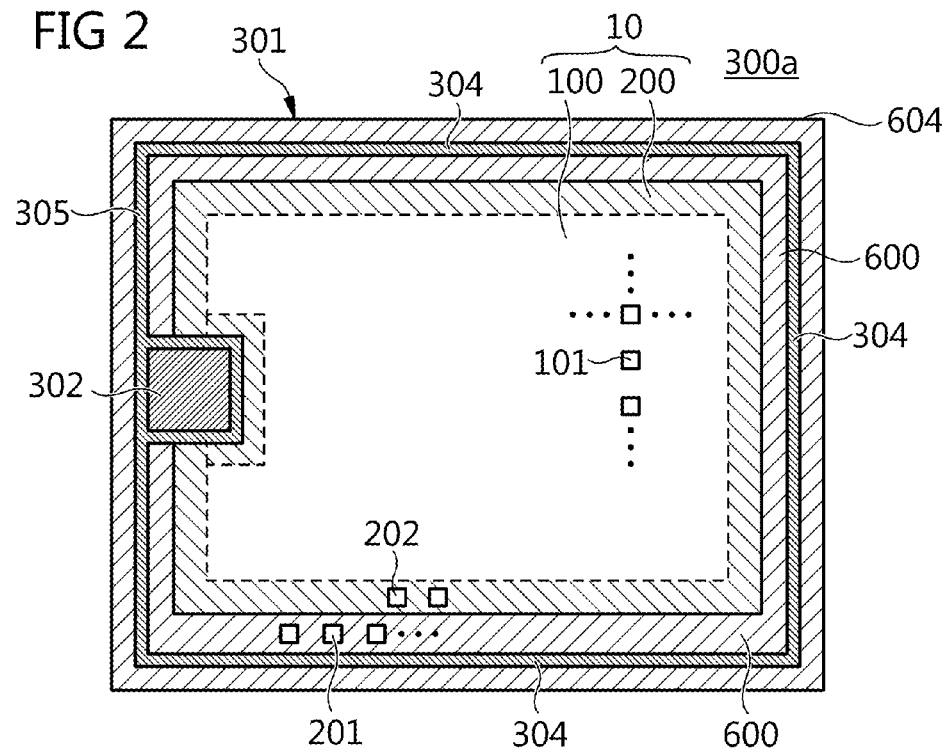

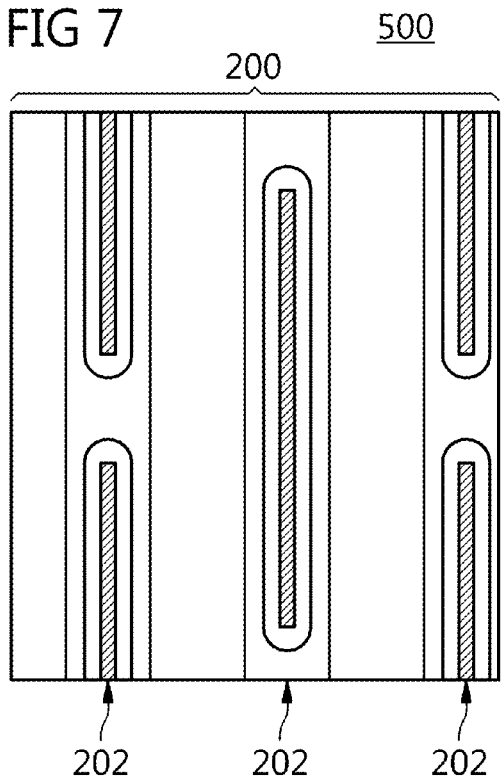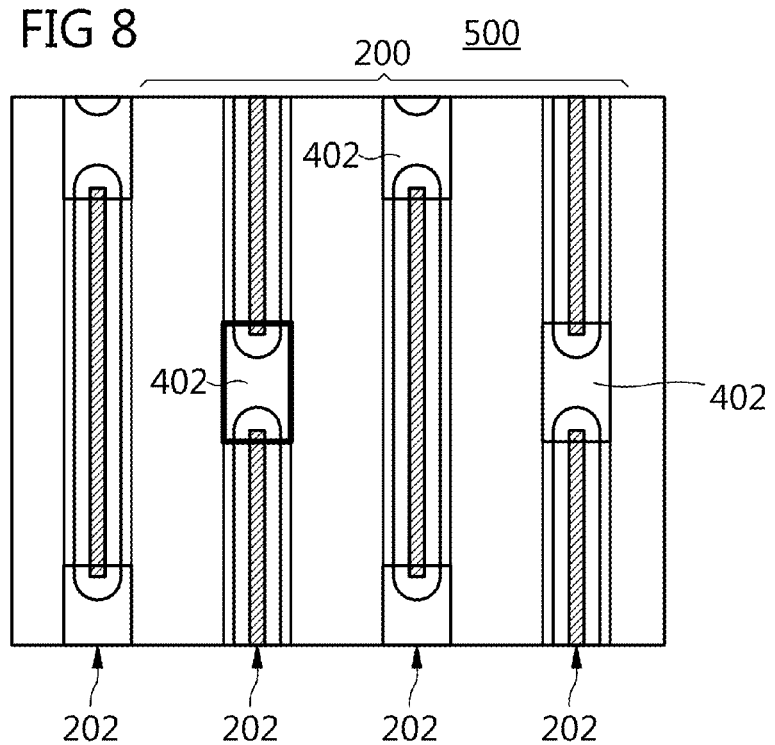

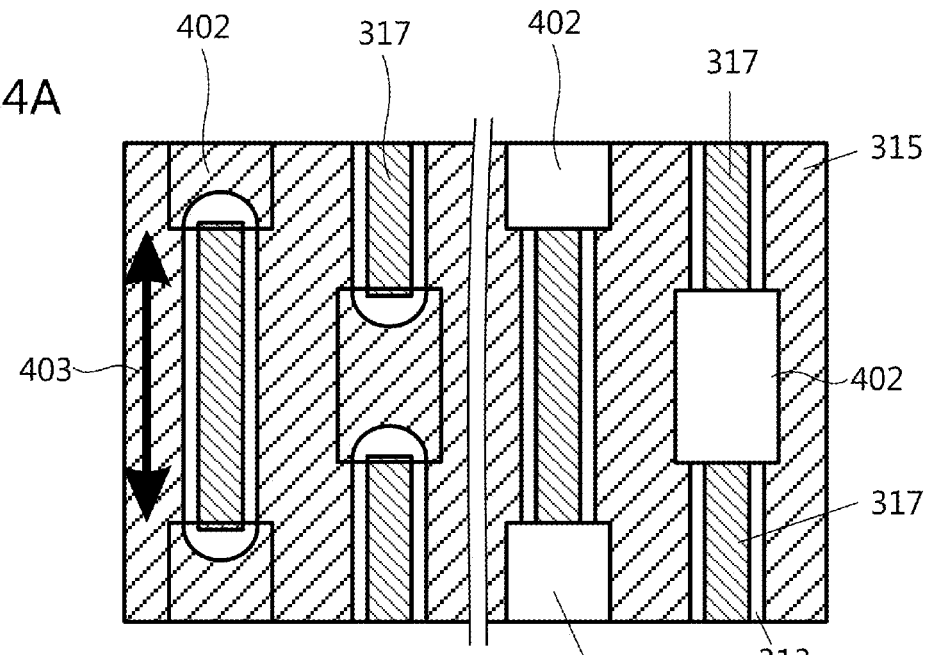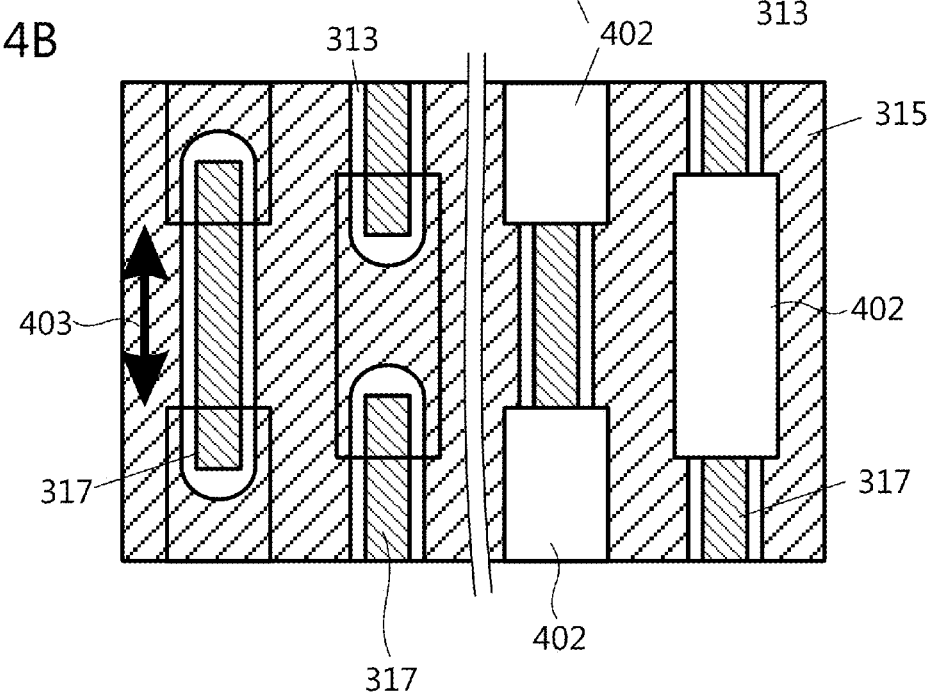

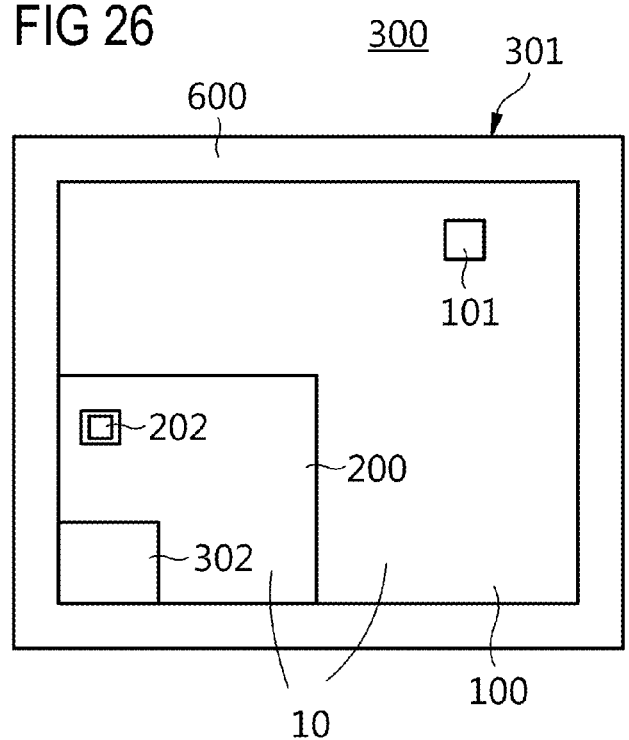
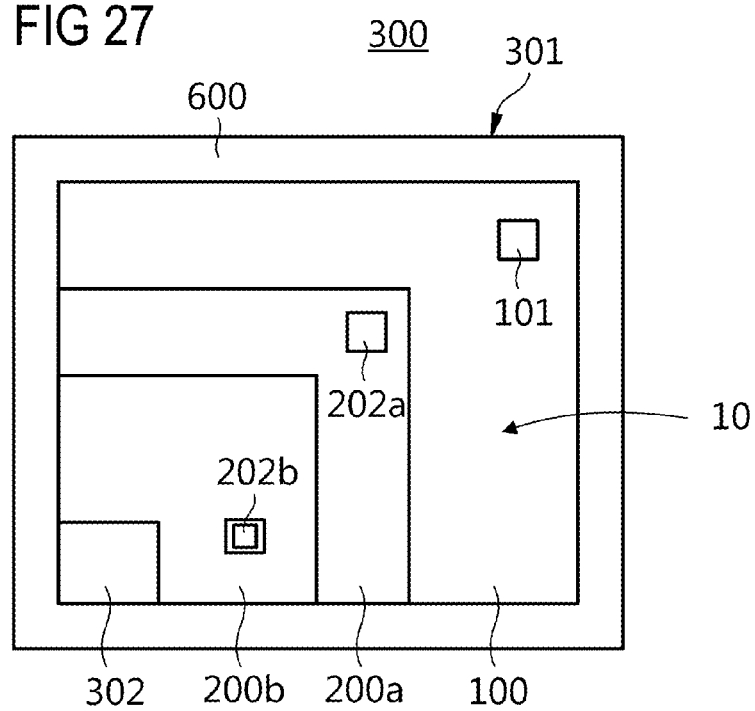

SEMICONDUCTOR SWITCHING DEVICES WITH DIFFERENT LOCAL TRANSCONDUCTANCE

TECHNICAL FIELD

Embodiments described herein relate to semiconductor devices and in particular to semiconductor switching devices such as semiconductor power switches having different local cell layout and in particular locally different transconductance. Furthermore, embodiments described herein relate to a cell layout of switchable cells located in an active area of the semiconductor device.

BACKGROUND

Semiconductor switching devices having large chip area are provided with gate signal emitters or gate runner structures such as gate pads, gate rings, or gate fingers for transferring an external switching signal provided by external circuitry to an ensemble of switchable cells arranged in an active area of the semiconductor switching device.

Cells located at or in the proximity of an outer rim of the chip area where the gate metallization is located can receive an external switching signal at a time before the external switching signal can reach switchable cells located in an inner region of the chip area. In particular, if a transient switching signal for a short duration occurs, only those cells close to gate signal emitters are addressed, and thus switched. The cells close to the gate signal emitters must therefore carry the full load current which can result in a current per cell higher than the rated current. Furthermore, this kind of inhomogeneous distribution of the external switching signal across the chip area can prevent the switchable cells from switching concurrently. Simultaneous operation of the switchable cells is thus not ensured and inhomogeneous switching can occur.

In view of the above, there is a need for improvement.

SUMMARY

According to an embodiment, a semiconductor device includes a semiconductor substrate having an outer rim, a plurality of switchable cells defining an active area, and an edge termination region arranged between the switchable cells defining the active area and the outer rim, wherein each of the switchable cells includes a body region, a gate electrode structure and a source region. A source metallization is in ohmic contact with the source regions of the switchable cells. A gate metallization is in ohmic contact with the gate electrode structures of the switchable cells. The active area defined by the switchable cells includes at least a first switchable region having a first transconductance and at least a second switchable region having a second transconductance which is different from the first transconductance.

According to an embodiment, a semiconductor device includes a semiconductor substrate having an outer rim, a plurality of switchable cells defining an active area, and an edge termination region arranged between the switchable cells defining the active area and the outer rim, wherein each of the switchable cells includes a body region, a gate electrode structure and a source region. A source metallization is in ohmic contact with the source regions of the switchable cells. A gate metallization is in ohmic contact with the gate electrode structures of the switchable cells. The active area defined by the switchable cells includes at least a first switchable region having respective channel regions each with a first channel width and at least a second switchable region having respective channel regions each with a second channel width which is different to the first channel width.

According to an embodiment, a method for manufacturing a semiconductor device includes: providing a semiconductor substrate having an outer rim, an active area, and an edge termination region arranged between the active area and the outer rim; forming a plurality of switchable cells in the active area, wherein each of the switchable cells includes a body region, a gate electrode structure and a source region, wherein the active area defined by the switchable cells includes at least a first switchable region having a first transconductance and at least a second switchable region having a second transconductance which is different from the first transconductance; forming a source metallization in ohmic contact with the source regions of the switchable cells; and forming a gate metallization in ohmic contact with the gate electrode structures of the switchable cells.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts.

FIG. 1 illustrates a semiconductor switching device having a main switchable region which is surrounded by an edge termination region, according to an embodiment.

FIG. 2 illustrates a semiconductor switching device having a first switchable region and a second switchable region arranged between the first switchable region and the edge termination region, according to an embodiment.

FIG. 7 illustrates details of a layout of a switchable cell in the transition region, according to yet another embodiment.

FIG. 8 illustrates shadowing masks provided for adapting the layout of a switchable cell, according to yet another embodiment.

FIG. 14A and FIG. 14B illustrate different cell layouts having different channel widths, according to an embodiment.

FIG. 26 depicts a semiconductor switching device having first switchable cells and second switchable cells in a specific arrangement, according to an embodiment.

FIG. 27 depicts a semiconductor switching device having first switchable cells and second switchable cells in another specific arrangement, according to an embodiment.

DETAILED DESCRIPTION

Figure 3:
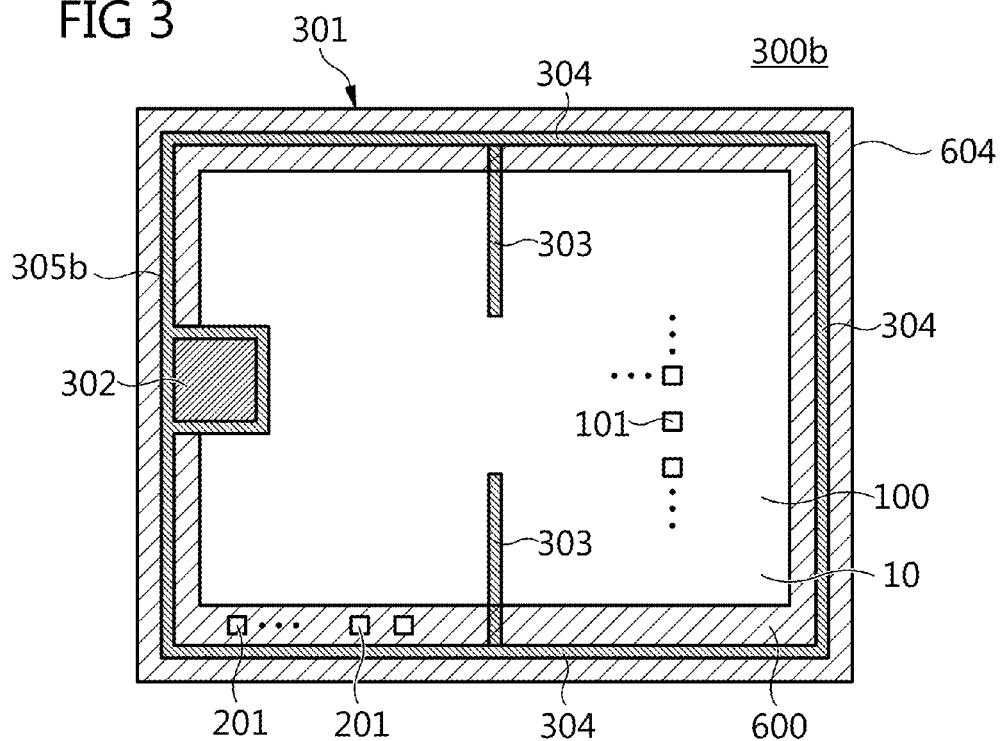
FIG. 3 illustrates a semiconductor switching device provided in a semiconductor substrate, wherein the gate metallization includes gate fingers, according to yet another embodiment.

In the following Detailed Description, reference is made to the accompanying drawings, which form a part hereof, and in which are shown by way of illustration specific embodiments in which the invention can be practiced. In this regard, directional terminology, such as "top," "bottom," "front," "back," "leading," "trailing," "lateral," "vertical," etc., is used with reference to the orientation of the Figure(s) being described. Because components of embodiments can be positioned in a number of different orientations, the directional terminology is used for purpose of illustration and is in no way limiting. It is to be understood that other embodiments can be utilised and structural or logical changes can be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a location of a structural feature relative to another structural feature with consideration of this orientation.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to also include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include electrically conductive materials such as, but not restricted to, metal, alloys, doped polycrystalline semiconductors and metal semiconductor compounds such as metal silicides.

Field-effect controlled switching devices such as Metal Oxide Semiconductor Field-effect Transistors (MOSFETs) or Insulated Gate Bipolar Transistors (IGBTs) have been used for various applications, including use as switches in power supplies and power converters, electric cars, air-conditioners, and even stereo systems. Particularly with regard to power devices capable of switching large currents and/or operating at high voltages, a low resistance in the conducting on-state is often desired. This means e.g. that, for a given current to be switched, the voltage drop across the switched-on FET, e.g., the source-drain voltage is desired to be low. On the other hand, the losses occurring during switching-off or commutating of the FET are often also to be kept small to minimize the overall losses.

The term "semiconductor power switch" as used in this specification describes a semiconductor device on a single chip with high voltage and/or high current switching capabilities. In other words, power semiconductor devices are intended for high current, typically in the Ampere range. Within this specification the terms "semiconductor power switch," "semiconductor switching device," and "power semiconductor device" are used synonymously.

In the context of the present specification, the term "active cell region" or "active area" describes a region of a semiconductor substrate of the semiconductor switching device where switchable cells which carry the load current are arranged. The switchable cells in the active area define the switching behavior of the semiconductor switching device. Specifically, an active area can include at least a main or first switchable region and a second switchable region, optionally more than two different switchable regions. Switchable cells in different switchable regions can differ from each other in at least one physical property such as the transconductance. The cells can also have a different cell layout in different switchable regions of the active area. The different switchable regions of the active area are also referred to as "sub-regions" of the active area and describe regions having switchable cells, or portions of switchable cells, with physical properties which are different to the physical properties of switchable cells of other sub-regions. In particular, different sub-regions can be manufactured with different channel width such that the local transconductance of an individual switchable cell or a group of individual switchable cells is different to the local transconductance of another individual switchable cell or another group of individual switchable cells.

In the context of the present specification, the term "cell pitch" or "longitudinal pitch" describes the pitch of the switchable cells in the active area along the longitudinal extension of the switchable cells.

In the context of the present specification, the term "gate electrode structure" describes a conductive structure which is arranged next to, and insulated from the semiconductor substrate by a dielectric region or dielectric layer. The gate electrode structure covers, when seen onto the surface of the semiconductor substrate, different regions of the semiconductor device such as body regions and drift regions. The gate electrode structure includes the gate electrodes of the switchable cells next to the body regions and also electrical connections between adjacent gate electrodes which are electrically connected with each other. The gate electrodes are configured to form and/or control the conductivity of a channel region in the body region, for example by the electric-field-mediated formation of an "inversion channel" in the body regions between the respective source regions and drift regions of the switchable cells. When forming an inversion channel, the conductivity type of the channel region is typically changed, i.e., inverted, to form a unipolar current path between the source and the drain region. The gate electrode structure is often conveniently referred to as gate polysilicon. The gate electrode structures of all switchable cells are typically contiguous or continuous to be in ohmic contact with each other.

Examples of dielectric materials for forming a dielectric region or dielectric layer between the gate electrode and the body region include, without being limited thereto, silicon oxide ($SiO_2$), silicon nitride ($Si_3N_4$), silicon oxynitride ($SiO_xN_y$), zirconium oxide ($ZrO_2$), tantalum oxide ($Ta_2O_5$), titanium oxide ($TiO_2$) and hafnium oxide ($HfO_2$), and combinations thereof including stacks of different insulating materials.

The terms "electrical connection" and "electrically connected" describes an ohmic connection between two elements.

In the context of the present specification, the term "gate signal emitter" describes an electrode configuration which provides transfer of external switching signals to the gate electrode structure of the switchable cells. Within this specification the terms "gate metallization" and "gate signal emitter" are used synonymously. Typically, the gate metallization is formed on the gate electrode structure to improve distribution of the switching signal. For example, the gate electrode structure is formed by polysilicon and can have a net-like structure covering the active area while the gate metallization is formed on and in ohmic contact with the gate electrode structure in the periphery of the semiconductor device, for example, in the edge termination area. The gate metallization can include, for example, a gate ring, or a gate ring and gate fingers extending from the gate ring into the active area. The net-like structure of the gate electrode structure includes openings for source contacts. Gate signal emitters typically have a lower specific resistance than the gate electrode structure. For example, gate signal emitters can be made of a more conductive material than the gate electrode structure and/or can be made thicker than the gate electrode structure to reduce the resistance. The gate signal emitters can be made of metal, metal alloy, or a metal layer stack.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

In the context of the present specification, the term "gate-drain capacitance" describes a capacitance formed between the gate electrode structure and the drain region of an individual switchable cell. Specifically, the gate-drain capacitance $C_{GD}$ can be dependent on the specific coverage ratio of the gate electrode structure in the active area. If designed with different geometry, switchable cells located at an outer chip area of the active area can have a larger gate-drain capacitance as compared to the gate-drain capacitance of switchable cells located in a more central area of the active area. The gate-drain capacitance of a switchable cell can be influenced by the gate connected polysilicon coverage at a position of the cell.

In the context of the present specification, the term "specific coverage ratio" describes a specific ratio between an area covered by a gate electrode structure in a given region (unit area) and the total area of the given region (unit area). The unit area can be, for example, the area of a single switchable cell. In this case, the specific coverage ratio is defined by the ratio of the area of the gate electrode structure of said cell to the total area of said switchable cell. The specific coverage ratio influences the gate-drain capacitance. Typically, the higher the specific coverage ratio, the higher the gate-drain capacitance for the given region. The given region, however, does not need to correspond to a single switchable cell. The coverage of the gate electrode structure is often referred to as gate polysilicon coverage.

In particular, the specific coverage ratio can be different for switchable cells located in regions of the active area which are located closer to a gate metallization of the semiconductor device as compared to switchable cells located in regions of the active area which are located further away from the gate metallization.

When describing switchable cells to be closer to the gate metallization, this can refer either to a geometrical distance of the respective switchable cell to the gate metallization (or gate emitter), or to the electrical value of the gate resistance that this switchable cell experiences. For example, the closer the switchable cell is arranged to the gate metallization, the lower is its gate resistance. As the resistance of the gate structure also varies depending on the layout of the switchable cells arranged between the gate metallization and a particular switchable cell, the gate resistance of two specific switchable cells can be different even when both have the same geometrical distance to the gate metallization. Therefore, "closer to the gate metallization" describes, when using the picture of electrical resistance, that a particular switchable cell has a lower gate resistance than another particular switchable cell.

The threshold voltage, commonly abbreviated as Vth, of a field-effect transistor (FET) is the value of the gate-source voltage at which the conductive properties of the FET significantly changes, with increasing gate-source voltage, either from non-conductive to conductive in case of enhancement devices of from conductive to non-conductive in case of depletion devices. The threshold voltage is also referred to as pinch-off voltage. For enhancement devices, an inversion channel is formed in the channel region of the body region next to the dielectric region or dielectric layer when the voltage between the gate electrode and the source region is above the threshold voltage Vth. At the threshold voltage, the channel region formed in the body region begins to establish an ohmic connection between the source and drain contacts of the transistor. Below this threshold voltage, the FET is non-conductive. Thus, the threshold voltage Vth often refers to the minimum gate voltage necessary for the onset of a unipolar current flow between the two semiconductor regions of the first conductivity type, which form the source and the drift or drain of a transistor structure.

Figure 31:
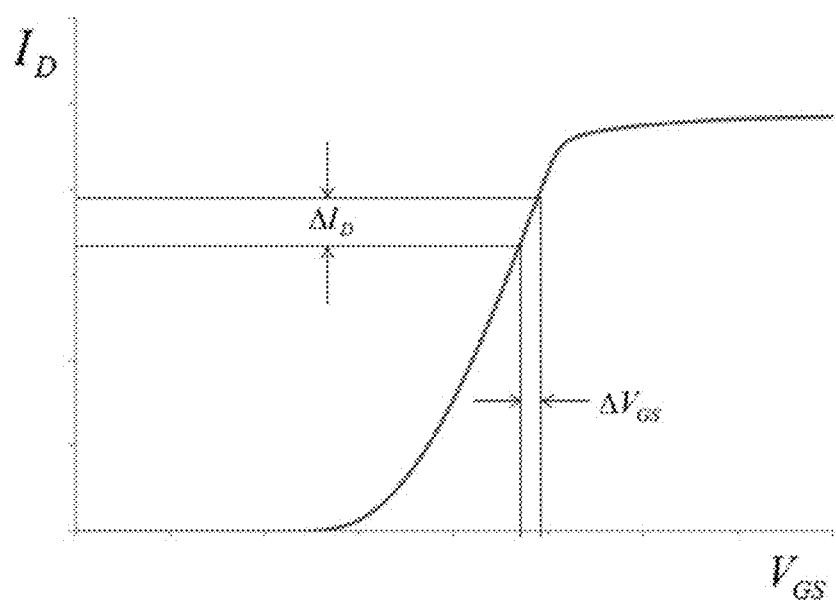
FIG. 31 illustrates a relation between the small-signal drain current and the gate-drain voltage to define the transconductance $g_m$.

In the context of the present specification, the term "transconductance" describes the slope or local gradient of an output current of a switchable cell as compared to an input voltage of this switchable cell. In other words, the term "transconductance" describes a physical value expressed in conductivity units, such as "Siemens" or "1/Ohm", the physical value representing an amplifier gain. A ratio of small-signal drain current $i_d = \Delta I_D$ to the gate-drain voltage $v_{gs} = \Delta V_{GS}$ can be identified as the transconductance $g_m$, such that:

$$g_m = \frac{\Delta I_D}{\Delta V_{GS}}$$

as, for example, illustrated in FIG. 31. Furthermore, a "specific transconductance" can be defined per unit area. The unit area can be larger than the area of a single switchable cell. Using the specific transconductance (transconductance per unit area) is more appropriate for semiconductor devices with locally different cell geometry and cell size.

In this context, switchable cells having low cell transconductance can exhibit a slower switching behavior as compared to switchable cells having a higher cell transconductance.

With reference to FIG. 1, a first embodiment of a semiconductor switching device 300 having a plurality of switchable cells 101 provided in a semiconductor substrate 301 is described. The semiconductor switching device 300 has an active area 10 with a main or first switchable region 100 which is surrounded by an edge termination region 600.

The semiconductor substrate 301 includes an outer rim 604, the active area 10, and the edge termination region 600 arranged between the active area 10 and the outer rim 604. The switchable cells 101 are arranged within and define the active area 10. Each of the switchable cells 101 can include a gate electrode structure and a source region. Furthermore, a source metallization is provided which is in ohmic contact with the source regions of the switchable cells 101 through respective contacts which extend through openings in the gate electrode structure. Furthermore, each switchable cell 101 includes a body region in which an inversion channel can be formed and/or controlled by the voltage applied to the gate electrodes.

In the edge termination region 600, inactive cells 201 are located. The inactive cells 201 are not switchable or are not capable of carrying a load current. Although the inactive cells 201 do not contribute to the load current, they are formed for process reasons and to facilitate the voltage relief in the edge termination area 600.

In situations with high $d(V_{DS})/dt$, with $V_{DS}$ being the drain-source voltage, or in case of commutation of the body diode of the semiconductor device there is a large (hole-) current contribution from the edge termination region 600. The cells close to the edge termination region 600 collect this current. If the large hole-current is flowing along an n-doped source region, it can trigger the emission of electrons from the n-region into the p-doped body-region. Such an emission would lead to extreme high currents and to destruction of the semiconductor device. In order to prevent this, the cells at the outer boundary of the active area 10 are often designed without n-doped source-regions so that they cannot contribute to the load current. Hence, these cells 201 are "inactive".

A gate metallization 305 is formed in this embodiment in regions outside the active area 10 and includes a gate ring or gate runner 304 and a gate pad 302.

Semiconductor switching devices can include, but are not restricted to, MOS (metal-oxide-semiconductor) transistors such as MIS (metal-insulator-semiconductor) devices. In particular, the plurality of switchable cells can form a transistor selected from the group consisting of a MOSFET, a MISFET, an IGBT, a SJFET (Super-Junction FET), and any combinations thereof. A SJFET is a compensation device. Accordingly, a MOSFET (metal-oxide-semiconductor field-effect transistor) can include a gate insulator, e.g. an oxide. The gate metallization 305 can include a gate runner structure or gate ring, a gate pad, a gate finger, or any combinations thereof. The gate electrode structure can include highly doped polysilicon. The gate metallization 305 can include at least one of a metal, a metal alloy, and a metal layer stack. According to yet a further modification, the gate metallization 305 can have a higher specific conductivity than the gate electrode structure.

A semiconductor switching device formed in a single chip can have high voltage and/or high current switching capabilities, resulting from the layout of the individual switchable cells 101 and the combination of the switching processes of an ensemble of switchable cells 101 provided on the semiconductor chip. Thereby, such semiconductor power switches can be used in many applications if the switching behavior of the individual switchable cells can be controlled efficiently.

Inhomogeneous switching can particularly occur for short-duration or short switching processes where predominantly those switchable cells close to gate signal emitters, e.g. close to gate metallization structures are switched. For example, a parasitic current at a gate of a switchable cell resulting from a fast change of a drain-source voltage can generate a short-duration voltage increase at the gate. A gate-source voltage $V_{GS}$ can amount to a value given by the following equation (1).

$$V_{GS} \approx R_G \times C_{GD} \times dV/dt \quad (1)$$

wherein $R_G$ is the gate resistance, $C_{GD}$ is the local gate-drain capacitance, and dV/dt is the voltage change rate. As described above, the gate electrode structure not only forms the actual gate electrodes but also the electrical connection to the gate metallization to distribute the gate signal. Since the gate electrode structure has a given specific resistance ($\Omega/mm^2$), the resistance $R_G$, which is mainly defined by the gate electrode structure, is higher for switchable cells 101 which are more remote from the gate metallization 305 than for switchable cells 101 which are arranged closer to the gate metallization 305 due to the larger distance from the gate metallization 305. Under certain circumstances, e.g. in an avalanche mode, the different gate resistance $R_G$ renders switchable cells 101 conductive at different points in time so that during this transition time the entire current through the semiconductor device is carried by few switchable cells 101 which were already rendered conductive. This can result in a local overstress of these switchable cells 101. Typically, switchable cells 101 in regions near the gate metallization 305 or edge termination region 600 are rendered conductive first and must therefore carry approximately the entire switching current whereas switchable cells 101 in a more central switchable region of the active area 10 are not or not completely switched, or switched at a later time. This non-uniform behavior is sometimes referred to as current splitting or formation of current filaments. Formation of current filaments stresses the involved switchable cells and can render the device inoperable.

According to embodiments, which can be combined with other embodiments described herein, physical properties of the switchable cells located near the edge termination region 600 and the gate signal emitters 305 can differ from physical properties of the switchable cells 101 located more centrally in the active area 10. Such modification is used to at least partially compensate for the inhomogeneous gate signal penetration. Typically, the switching of switchable cells 101 which are arranged closer to the gate signal emitters 305 are retarded so that the gate signal can penetrate deeper into the active area 10 before the switchable cells 101 close to the gate signal emitter 305 become conductive. This increases the number of switchable cells 101, which are turned on (become conductive) during the short period of time defined by a short period switching signal. Local overstress in the region of the switchable cells 101 rendered conductive can be avoided or at least reduced.

According to an embodiment, the locally varying property is the transconductance. For example, the active area defined by the switchable cells can include at least a first switchable region having a first transconductance and at least a second switchable region having a second transconductance, which is different from the first transconductance.

According to an embodiment, the locally varying physical property is the gate-drain capacitance. The gate electrode structure of switchable cells 101, which are arranged closer to the gate metallization 305, can have a cell layout which is different to the cell layout of the gate electrode structure of switchable cells 101, which are arranged further away from the gate metallization 305. For example, the specific coverage ratio of switchable cells 101 which are arranged closer to the gate metallization 305 can be larger than the specific coverage ratio of switchable cells 101 which are arranged further away from the gate metallization 305. Typically, by changing the cell layout such as the cell size or pitch, the specific coverage ratio can be adapted.

According to an embodiment, the transconductance is the only varying physical property. In further embodiments, both the transconductance and the gate-drain capacitance are varied.

For example, switchable cells 202 located closer to the gate metallization can have a transconductance which is lower than a transconductance of switchable cells 101 located further away from the gate metallization. In further embodiments, switchable cells 202 located closer to the gate metallization can have a transconductance which is higher than a transconductance of switchable cells 101 located further away from the gate metallization.

According to a further embodiment, which can be combined with other embodiments described herein, the locally varying physical property is the threshold voltage Vth to compensate the varying signal penetration. Switchable cells 101 located closer to the gate metallization 305 can have a threshold voltage Vth which is higher than a threshold voltage Vth of switchable cells 101 located further away from the gate metallization 305. In particular, the threshold voltages of the switchable cells 101 can be in a range from 2 volts to 7 volts, and specifically can be between 4 to 5.5 volt for switchable cells 101 located close to the gate metallization 305, and can be between 3 to 3.5 volt for switchable cells 101 located further away from the gate metallization 305. The difference in the threshold voltage between different sub-regions can be at least 0.2 mV, and typically between 0.5 V and 2 V.

According to an embodiment, which can be combined with other embodiments described herein, the body regions of switchable cells 101 located closer to the gate metallization 305 can have a higher doping concentration (for example an additional p-implantation) than the body regions of switchable cells 101 located further away from the gate metallization 305. For example, the active area 10 can include a plurality of switchable cells 101 each having a source region and a body region, wherein each switchable cell 101 has a specific body implantation concentration, and wherein the body implantation concentration of switchable cells 101 arranged in an outer region of the active area 10 is higher than in a central region of the active area 10 which is surrounded by the outer region. A typical doping level of the body regions is in the region of $10^{17}/cm^3$. The body regions of switchable cells 101 located closer to the gate metallization 305 can have a doping concentration which higher by about 5% to 100% than the doping concentration of the body regions of switchable cells 101 located further away from the gate metallization 305.

FIG. 2 illustrates a semiconductor switching device 300a having a first switchable region 100 and a second switchable region 200 arranged between the first switchable region 100 and the edge termination region 600, according to another embodiment. The first switchable region 100 includes a plurality of first switchable cells 101, and the second switchable region 200 includes a plurality of second switchable cells 202. The second switchable region 200 can at least partially surround the first switchable region 100 as illustrated in FIG. 2.

Alternatively, the first switchable region 100 can at least partially surround the second switchable region 200. The gate signal emitter formed by the gate metallization 305 and gate pad can thus be arranged in a central portion of the semiconductor device when seen from a top view.

A switchable cell 101, 202 has a given layout and can be defined by a single continuous or contiguous source region when viewed onto the semiconductor substrate. The size of the switchable cells 101, 202 can vary in the active area 10. According to an embodiment, the active area 10 can include switchable cells 101, 202 of different size and/or layout, or can include switchable cells 101, 202 of the same size but different layout. An example is the so-called stripe layout where the source regions have the shape of long strips. As the strips can be comparably long and can even extend from a first side of the edge termination area 600 to a second side of the edge termination area 600 opposite the first side when viewed onto the semiconductor substrate, a single switchable cell 101, 202 can extend from the first switchable region 100 to the second switchable region 200. In this case, one portion of the switchable cell forms part of the first switchable region 100 while another portion of the switchable cell forms part of the second switchable region 200. Such a switchable cell 101 will than have portions with different physical properties. Hence, the boundary between the first and second switchable regions 100, 200 do not need to correlate to the location and boundary of individual switchable cells 101, 202.

In further embodiments, an individual switchable cell completely forms part either of the first switchable region 100 or of the second switchable region 200, or even of a third switchable region if three different switchable regions are formed. In this case, each switchable region has a given specific transconductance with the specific transconductance of the different switchable regions being different from each other.

As shown in FIG. 2, the second switchable region 200 is arranged near or adjacent to the edge termination region 600. The second switchable cells 202 are provided with a different transconductance than the first switchable cells 101 in the first switchable region 100. For example, the transconductance can be lower in the second switchable region 200 in comparison to the first switchable region 100.

The division of the active area 10 in different regions with different transconductances modifies the overall properties of the whole semiconductor device. Modifying the number of regions, their size and their locally defined transconductance allows tailoring of the overall electrical properties of the semiconductor device, particularly the transfer characteristic, to better adapt the semiconductor device to the specific needs of the final application. For example, in the typical transfer characteristics of high voltage MOSFETs the effective transconductance at lower currents, which are those most typical in the normal operation mode of the applications, are quite low, thus leaving room for an improvement of the switching losses by means of a higher transconductance. On the other hand, at higher currents the effective transconductance is much higher and remains high almost up to the saturation current, which is far beyond the normal mode current in the application and are only relevant in extreme cases, for example at short circuit. In these cases, a low transconductance is desirable to provide a softer behavior.

Reducing the transconductance of switchable cells close to the gate metallization 305, i.e. close to the gate signal emitters, allows a softer switching behavior of the semiconductor device.

According to an embodiment, switchable cells of the first switchable region 100 have a saturation current which is equal to or lower than the saturation current of switchable cells of the second switchable region 200. This allows tailoring of the current regimes of the switchable regions. For example, the final transfer characteristic can be adapted so that, in the low current regime, the switchable cells of the first switchable region 100 can dominate the switching process which provides an overall reduction of the switching losses. The switchable cells of the second switchable region 200 do not significantly contribute to the current as their transconductance is lower.

Furthermore, in the high current regime, the combination of switchable cells of the first and second switchable region can provide a lower overall transconductance than in the case where all switchable cells have the same transconductance. The locally varying transconductance thus contributes to a softer switching behavior of the semiconductor device.

The switchable cells of the first switchable region can also be referred to as "main cells," while the switchable cells of the second switchable region 200 can be referred to as "support cells."

The transconductance can be adjusted by providing the switchable cells with different effective channel width. For example, a so-called channel shadowing mask can be used which partially masks the source n+ implantation of a switchable cell to reduce the length of the source region. This leads to a lower transconductance in comparison to switchable cells which are formed without such a mask. According to an embodiment, the usage of different channel shadowing degrees in different regions of the active area allows the local adaptation of the transconductance.

The active area 10 can therefore include a first switchable region 100 of first switchable cells 101, each first switchable cell 101 having a first transconductance, and at least a second switchable region 200 of second switchable cells 202, each second switchable cell 202 having a second transconductance, wherein the second transconductance is lower than the first transconductance, and wherein the second switchable region 200 is arranged between the first switchable region 100 and the gate metallization 305.

The transconductance can be generally adjusted by varying the ratio of the channel width to the channel length. Typically, the channel width is varied while keeping the channel length constant.

According to an alternative embodiment, the second transconductance is larger than the first transconductance.

Figure 24:
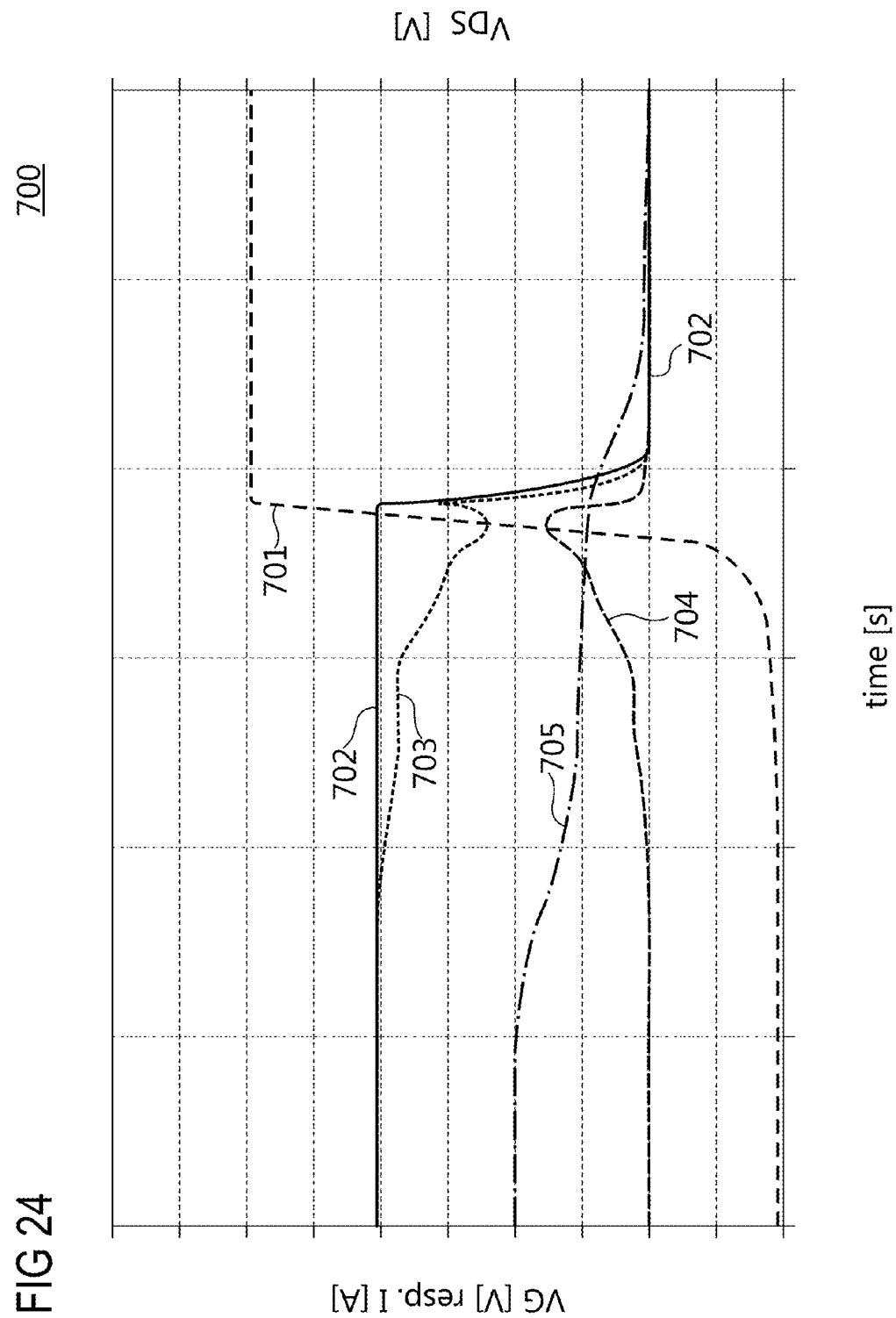
FIG. 24 is a graph illustrating a switching-off behavior of a semiconductor switching device, according to an embodiment.
Figure 25:
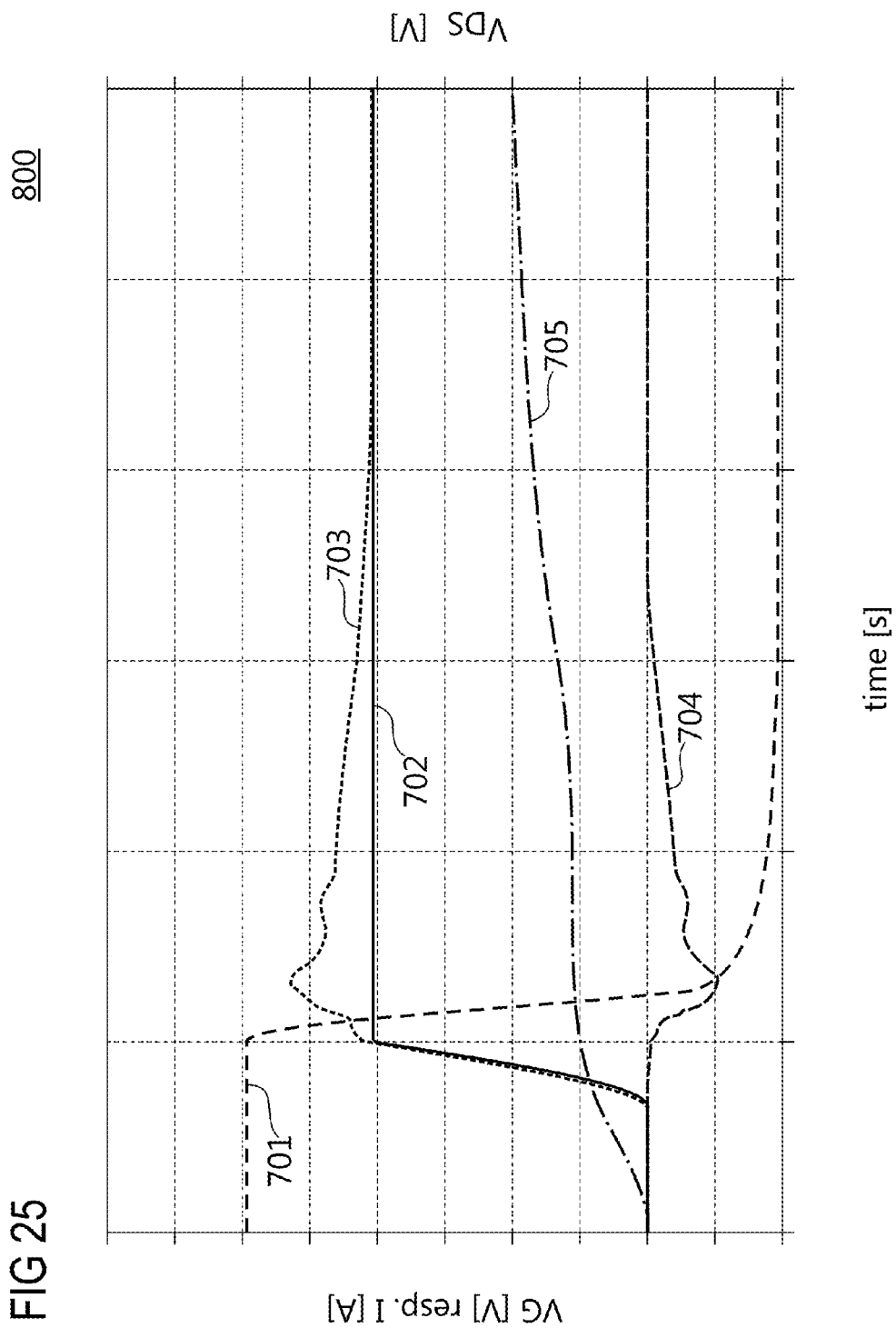
FIG. 25 is a graph illustrating a switching-on behavior of a semiconductor switching device, according to an embodiment.

The effect of a higher transconductance close to the gate signal emitters is described with reference to FIG. 24 and FIG. 25. It is noted here that the curves indicated in the graphs of FIGS. 24 and 25 are based on the assumption of a specific overall transconductance which has been adjusted according to embodiments described herein. Thereby, the specific overall transconductance is based on the individual cell transconductances of switchable cells arranged in the active cell area. The examples of FIGS. 24 and 25 are based on a superjunction FET, also referred to as compensation device which uses p-columns to support depletion of the drift region.

Herein, FIG. 24 is a graph for illustrating a switching-off behavior of a semiconductor switching device, wherein FIG. 25 is a graph for illustrating a switching-on behavior of a semiconductor switching device. In FIG. 24 and in FIG. 25 different curves are shown: the solid line, curve 702, represents the drain-source current $I_{DS}$, the dashed line, curve 701, represents the drain-source voltage $V_{DS}$, the dash-dotted line, curve 705, represents the gate-source voltage $V_{GS}$, the dashed line 704 represents the hole current, and the dotted line 703 represents the electron current. The curves are drawn as a function of time, in seconds, in this example in a microsecond range.

As shown in FIG. 24, the gate-source voltage $V_{GS}$ 705 decreases in order to initiate the switching-off operation. The drain source current $I_{DS}$ 702 can thus not be maintained by the switchable cell. Concurrently, the hole current 704 peaks for a short period of time in order to discharge the compensation regions (the p-columns). Inversely, the electron current 703 dips for short moment in time just before the drain-source current 702 decreases to zero. At the moment in time when both a peak in the hole current 704 and a dip it in the electron current 703 occurs, the drain-source voltage $V_{DS}$ 701 increases to its maximum value. It is noted here, that the units for the drain-source voltage 701 are indicated on the right vertical axis of the graph, wherein the remaining quantities are indicated on the left vertical axis of the graph shown in FIG. 24.

On the other hand, FIG. 25 indicates a typical switching-on behavior of a semiconductor switching device 200. Again the four quantities, i.e. drain-source voltage 701, drain-source current 702, electron current 703, hole current 704, and gate-source voltage 705 are indicated in the graph of FIG. 25, as has already been described with reference to the graph of FIG. 24. If the gate-source voltage 705 rises above a predetermined level, the drain-source current 702 increases to its maximum value in a short time. At the same time the drain-source voltage 701 decreases to its minimum value. As the load capacity has to be discharged during switching-on operation, the electron current 703 increases, for a short moment in time, above the drain-source current 702. The indicated peaking of the electron current 703 determines the voltage slope dv/dt.

The main switching losses occur upon switching-on. Since the hole current flows only from the source region into p-columns, the hole current does not pass through regions of high electrical field strength and thus does not generate high losses. To put it differently, energy is stored in the output capacity is dissipated upon switching-on.

Upon switching-on, the electron current of the discharge current of the output capacity flows through the channel and then through the space-charge region. This current converts the energy stored in the output capacity into heat.

Switching-on and switching-off show different behavior with respect to the transconductance. Typically, the switching-on is less critical, with respect to the device's performance than the switching-off. This allows providing the semiconductor device with different transconductances for switching-on and switching-off.

As described above, the switchable cells arranged closer to the gate signal emitter switches first upon switching-on and switching-off due to the increased gate resistance for the individual cells depending on the "distance" from the gate signal emitter. Assume that both the switching-on and switching-off occurs over a given time period, typically in microsecond range. Upon switching-on, switchable cells close to the gate signal emitter contributes to the load current earlier than switchable cells arranged further away from the gate signal emitter. On the other hand, upon switching-off, switchable cells close to the gate signal emitter contributes to the load current only at the beginning of the switching-off process as these cells are switched-off rather quickly in comparison to switchable cells arranged further away from the gate signal emitters. Hence, the switchable cells arranged closer to the gate signal emitter do not have an influence on the switching characteristic of the semiconductor device at the end of the switching-off process, i.e. at the end of the Miller plateau.

Therefore, when providing the switchable cells close to the gate signal emitter with a larger transconductance in comparison to the switchable cells located further away from the gate signal emitter, only the voltage slope dv/dt of the switching-on process is increased, which is, however, rather uncritical. On the other hand, the steep voltage slope dv/dt of the switching-off process is reduced due to the larger transconductance of the switchable cells arranged closer to the gate signal emitter.

Having a larger transconductance closer to the gate signal emitters is also beneficial for the losses as the switching-on period, where most of the electrical losses occur, is made shorter. Hence, the overall electrical losses of the semiconductor device can be reduced.

The above described local variation of the transconductance does not have an influence of the homogeneity of the current distribution when completely switched-on. For example, all switchable cells, regardless of having a low or high transconductance, are completely switched-on, for example when applying a gate voltage of 10 V.

According to an embodiment, the transconductance of the semiconductor device locally varies to tailor the switching-on and switching-off behavior of the semiconductor device. This is particularly beneficial for superjunction or compensation devices. The local adaptation of the transconductance can be provided by changing the width-to-length ratio of the channel region of the switchable cells.

FIG. 3 illustrates a semiconductor switching device 300b provided on a semiconductor substrate 301 with a modified gate metallization 305b, according to yet another embodiment which can be combined with other embodiments described herein. As shown in FIG. 3, the gate metallization 305b of the semiconductor switching device 300b includes, in addition to the gate metallization 305 shown in FIG. 1, gate fingers 303. The gate metallization 305b includes the gate ring 304, the gate pad 302, and the gate fingers 303. Two gate fingers 303 are shown in FIG. 3. The number of the gate fingers 303 is not restricted to two and can be three, four, five, or even more. The gate fingers 303 transfer the switching signal more efficiently into the active area 10. The gate signal emitter formed by the gate metallization 305b thus extends closer to main switchable cells 101 as compared to the arrangement shown in FIG. 1.

Figure 4:
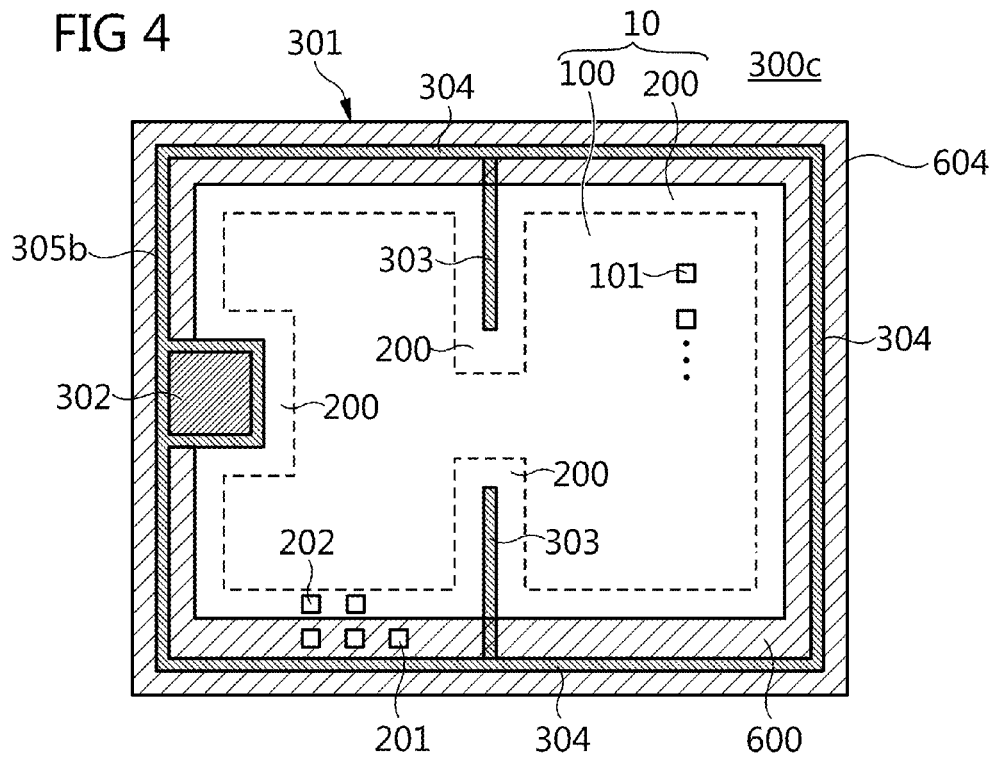
FIG. 4 is a schematic drawing of the semiconductor switching device shown in FIG. 3, wherein a second switchable region is provided close to the gate metallization, according to yet another embodiment.

FIG. 4 is a schematic drawing of the semiconductor switching device 300c having an additional second switchable region 200 which is provided close to the gate metallization 305b. Since the gate metallization 305b includes gate fingers 303 extending deeply into the active area 10, the second switchable region 200 also extends deeply in the active area 10 and surrounds the gate fingers 303. As best illustrated in FIG. 4, the second switchable region 200 is arranged between the first switchable region 100 and the gate metallization 305 also in the regions where the gate fingers 303 are formed since the switchable cells 202 arranged closer to the gate fingers 303, i.e. which have a smaller distance to the gate fingers 303, would also "see" the gate voltage earlier than switchable cells 101 arranged in a greater distance to the gate fingers 303.

According to embodiments which can be combined with other embodiments described herein, a ratio of the area of the second switchable region 200 to the total area of the first and second switchable region 100 can be in a range from 5% to 50%, particularly in a range from 10% to 40%, and specifically can amount to approximately 30%. The first switchable region 100 can be larger than the second switchable region 200. In case of three switchable regions, the total area of the second and third switchable region can be in a range from 5% to 50% of the total area of all three switchable regions (first, second and third switchable region). According to an embodiment, the second switchable region 200 is designed in a way that its area is not more than 15% of the area of the first switchable region 100. When the semiconductor device includes three or four switchable regions having different transconductance, the first switchable region 100 having the highest transconductance can be larger than the total area of the second to fourth switchable region. In an alternative embodiment, the first switchable region 100 can have the lowest transconductance.

In a more specific embodiment, the second switchable region can be very small, only 1% or even less of the total area of the first and second switchable regions. This specific embodiment allows, on the one hand, that the second switchable region is protected from taking over too much current during a switching operation, and, on the other hand, that the overall transconductance is not changed significantly. By this embodiment, the overall switching speed is not changed, but an overload of the cells in the second switchable region is prevented.

As described above, physical properties of the second switchable cells 202 are adapted to be different from physical properties of the first switchable cells 101 to adapt the switching behavior for partially compensating of the inhomogeneous gate signal distribution in the active area 10. The adapted physical property can be, for example, the gate-drain capacitance $C_{GD}$ and/or the threshold voltage Vth and/or the transconductance of the respective switchable cells 101, 202. The gate-drain capacitance $C_{GD}$ and/or the threshold voltage Vth of the second switchable cells 202 can be higher than the gate-drain capacitance $C_{GD}$ and/or the threshold voltage Vth of the first switchable cells 101, whereas the transconductance of the second switchable cells 202 can be different from the transconductance of the first switchable cells 101. According to an embodiment which can be combined with other embodiments described herein, the transconductance of the second switchable cells 202 can be lower than from the transconductance of the first switchable cells 101. According to another embodiment which can be combined with other embodiments described herein, the transconductance of the second switchable cells 202 can be higher than from the transconductance of the first switchable cells 101.

For locally adapting the threshold voltage Vth, the body regions of the second switchable cells 202 can have a higher p++ implantation than the body regions of the first switchable cells 101 located further away from the gate metallization 305, 305b.

Figure 12:
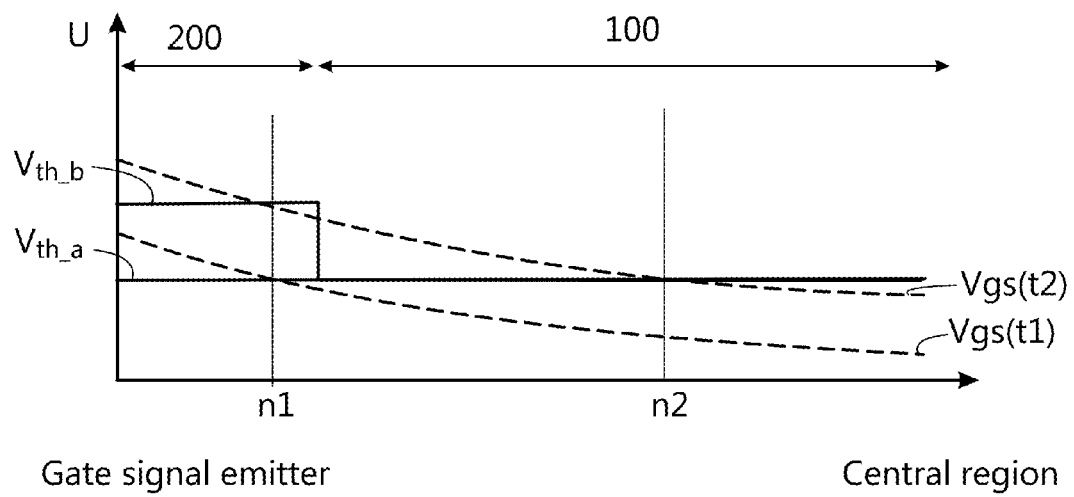
FIG. 12 illustrates the switching behavior of a semiconductor device, according to an embodiment.

FIG. 12 illustrates the switching behavior of a semiconductor device having two cells regions with different threshold voltage according to an embodiment. The threshold voltage of the first switchable cells 101 corresponds to Vth_a while the threshold voltage of the second switchable cells 202 corresponds to Vth_b. Hence, the switchable cells 202 in the second switchable region 200 have a higher threshold voltage than the switchable cells 101 in the first switchable region 100. For comparison, the threshold voltage Vth_a of a device with a constant threshold voltage throughout the active area is also shown. The abscissa indicates the geometrical distance of the cells from the gate metallization.

When a voltage signal is applied to the gate signal emitter (gate metallization 305 or 305b), the voltage signal is not immediately distributed to all switchable cells. A very schematic voltage distribution Vgs(t1) at a time t1 and at a later time t2 as Vgs(t2) is indicated in FIG. 12. For a given cell to be switched, the local voltage at the respective gate of the switchable cell needs to be at least equal to the threshold voltage of this cell. For t1 and a device having a constant threshold voltage Vth_a for all cells, the number of cells which are rendered conductive at t1 is n1. The number n1 represents here the number of all cells between the gate signal emitter and the location where the local voltage U is equal to or higher the threshold voltage Vth_a. Hence, few cells are already conductive in the device having a constant threshold voltage so that these cells must carry the full load current.

Different thereto, when the threshold voltage Vth_b is locally raised in the second switchable region 200 while keeping the threshold voltage in the first switchable region 100 at low level, the number of cells which are rendered conductive at time t1 is zero as Vth is less than the respective local threshold for all switchable regions 100, 200.

For time t2, the number of conductive cells of the device with constant threshold voltage Vth_a is n2. Since the local voltage U in the second switchable region 200 is also higher than Vth_b, the number of cells of the device with different threshold voltage is also n2. The main difference is that for a device with a locally increased threshold voltage Vth_b in the second switchable region 200, the cells in the second switchable region 200 become conductive at a later stage.

Figure 13:
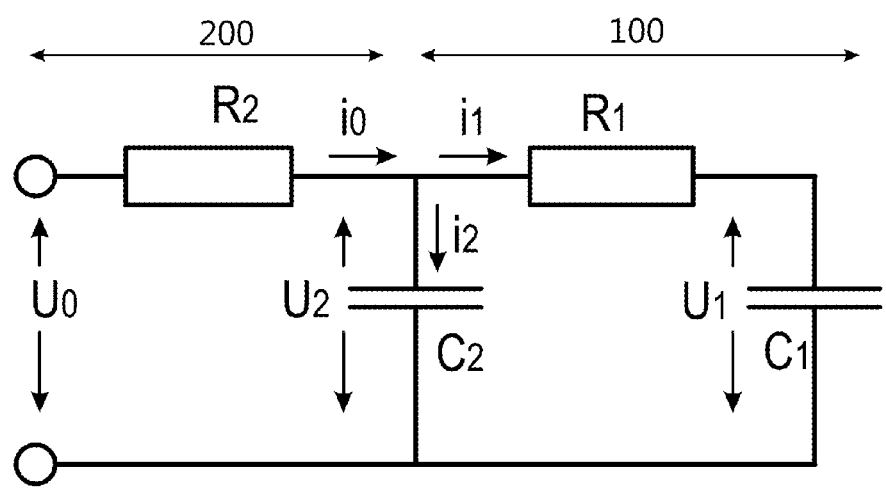
FIG. 13 illustrates the effect of a locally adapted gate-drain capacitance.

The effect of a locally varying gate-drain capacitance is schematically illustrated in FIG. 13. For ease of explanation, only two switchable cells representative for the first and second switchable region 100, 200 are illustrated. The second switchable cell has the gate-drain capacitance C2 and the first switchable cell has a gate-drain capacitance C1. U0 represent the voltage applied to the gate metallization. Assume that C2 is equal to C1, and R1 is equal to R2. Then C2 is charged faster than C1. The voltage U1 across C1 is smaller than U2 as it holds: $U1=U2-i1*R1$.

When C1 would be much larger than C2, the charging of C1 is retarded and the voltage U1 across C1 would be low for a longer time. This means that the gate voltage for the switchable cell in the second switchable region 200 is low and thus this switchable cell is not rendered conductive.

When C2 would be much larger than C1, the charging of C2 is retarded. However, the charging of C1 would also be slower as U1 cannot be larger than U2. On the other hand, the voltage U1 across C1 having a much lower capacitance than C2 would be more closer to U2 in comparison to the case where C1 would be much larger than C2.

Hence, by making C2 larger than C1, the voltages U1 and U2 have a more similar voltage rise than in the case when C1 is equal C2.

It is noted that the effective gate resistance for the first switchable cell (region 100) is R1+R2, while the effective gate resistance for the second switchable cell (region 200) is R2. Typically, R1 is equal to R2. In embodiments described herein, R2 can be lower than R1. For example, by locally varying the cell layout, particularly the layout of the gate electrode structure, R2 and R1 can be adapted. The variation of the cell layout can also be used to adapt the gate-drain capacitance. For varying the threshold voltage, typically the doping concentration of the body regions of the cells is locally adapted.

According to an embodiment, the total gate-drain capacitance of the device remains unchanged to keep the electrical properties of the whole device constant. Based on the total gate-drain capacitance of the device and the number of cells, one can define a mean gate-drain capacitance Cgd0 per cell. The gate drain capacitance Cgd1 of each first switchable cell 101 can thus be reduced in comparison to the mean gate-drain capacitance Cgd0 while the gate-drain capacitance Cgd2 of the second switchable cells 202 can be increased in comparison with the mean gate-drain capacitance Cgd0. Since the gate drain capacitance also influences the switching speed of a switchable cell, the first switchable cells 101 are adapted to switch faster than the second switchable cells 202. This at least partially counteracts the retarded distribution of the gate signal into the active area 10.

As explained further below, the number of switchable regions with different transconductance can be larger than two. This allows for a better "approximation" of the gate voltage signal distribution, so that the number of switchable cells which become conductive at the same time or within a very short duration increases. The differences of the transconductance between the different switchable regions vary, for example, between 30% to 300%. Typically the difference of the transconductance between first and second switchable region varies by a factor of 2. In some fields of application the overall transconductance can be changed, but in other fields of application the overall transconductance can remain unchanged, so that only the cells in special regions like the second and/or third switchable region are protected from current overloading.

Detailed structures of switchable cells are described herein below with reference to FIG. 5 to FIG. 8.

A method of manufacturing a semiconductor switching device 300 can be illustrated with respect to the cell layout depicted in FIG. 5 to FIG. 8. The method includes providing a semiconductor substrate 300 having an outer rim 604, an active area 10, and an edge termination region 600 arranged between the active area 10 and the outer rim 604. A plurality of switchable cells 101 is formed in the active area 10, wherein each of the switchable cells 101 includes a gate electrode structure and a source region. A source metallization is formed in ohmic contact with the source regions of the switchable cells 101. Furthermore, a gate metallization 305 is formed in ohmic contact with the gate electrode structures of the switchable cells 101

The transconductance of the switchable cells 101 can be locally adapted such that the transconductance of the switchable cells 101 located closer to the gate metallization 305 is larger than the transconductance of switchable cells 101 located further away from the gate metallization 305.

In addition to that, a threshold voltage Vth of the switchable cells 101 located closer to the gate metallization 305 is set to be higher than the threshold voltage Vth of switchable cells 101 located further away from the gate metallization 305. Tailoring of the threshold voltage Vth can be provided by adjusting implantation dose.

In addition to that, or alternatively, switchable cells located closer to the gate metallization 305 can have a gate-drain capacitance Cgd larger than a gate-drain capacitance Cgd of switchable cells located further away from the gate metallization 305.

According to an embodiment, a method for manufacturing a semiconductor device includes providing a semiconductor substrate having an outer rim, an active area, and an edge termination region arranged between the active area and the outer rim. A plurality of switchable cells is formed in the active area, wherein each of the switchable cells includes a body region, a gate electrode structure and a source region. The active area defined by the switchable cells includes at least a first switchable region having a first transconductance and a second switchable region having a second transconductance which is different from the first transconductance. A source metallization is formed in ohmic contact with the source regions of the switchable cells. A gate metallization is formed in ohmic contact with the gate electrode structures of the switchable cells.

According to an embodiment, a source implantation is performed for forming the source regions of the switchable cells using an auxiliary implantation mask, wherein the auxiliary implantation mask defines implantation openings of different size for the first and second switchable region. By providing openings with different size in the auxiliary implantation mask, switchable cells with different channel width can be formed.

The adjustment of the transconductance can thus include forming an implantation mask and implanting dopants to form body regions. The implantation mask includes openings arranged in the active cell area which define the location of the body regions of the switchable cells. Typically, the openings of the implantation mask which are arranged in the active area can have the same size so that the body regions of all switchable cells in the active area have the same size. The cell pitch is then the same for all switchable cells. In a modification, the openings in the implantation mask can have a different size in different cell regions of the active area. The cell pitch is then the different for the switchable cells. The doping process for forming the body regions can be referred to as first implantation process.

According to an embodiment, an implantation mask is formed which has openings defining the location of the body regions of the switchable cells of the first and second switchable region. Using a first implantation process which employs the implantation mask, first dopants are implanted through the openings of the implantation mask into the semiconductor substrate to form the body regions of the switchable cells of the first and second switchable region. An auxiliary implantation mask is formed on the implantation mask after implanting the first dopants, wherein the auxiliary implantation mask partially covers the openings of the implantation mask in at least one of the first and second switchable region. Using a second implantation process which employs the implantation mask and the auxiliary implantation mask, second dopants are implanted through the openings of the implantation mask and the auxiliary implantation into the semiconductor substrate to form the source regions of the switchable cells of the first and second switchable region.

To locally adjust the transconductance, the auxiliary implantation mask can be additionally formed on the implantation mask. The openings of the auxiliary implantation mask partially cover the openings of the implantation mask. For example, the openings of the implantation mask are partially covered in one switchable region to a greater extent than in another switchable region of the active area. For example, the openings in the implantation mask in a region near the gate metallization can be covered to a larger extent than openings of the implantation mask located further away from the gate metallization. Alternatively, the openings in the implantation mask in a region near the gate metallization can be covered to a lesser extent than openings of the implantation mask located further away from the gate metallization.

The implantation mask together with the auxiliary implantation mask defines a common implantation mask for the source implantation which can be referred to a second implantation process. Dopants of opposite type are used for the first and second implantation process as the body regions are of opposite conductivity type to the source regions.

In a further embodiment, the auxiliary implantation mask is formed on the gate electrode structure without any implantation mask. The gate electrode structure functions as implantation mask for the second implantation process so that the gate electrode structure together with the auxiliary implantation mask form a common implantation mask.

Figure 5:
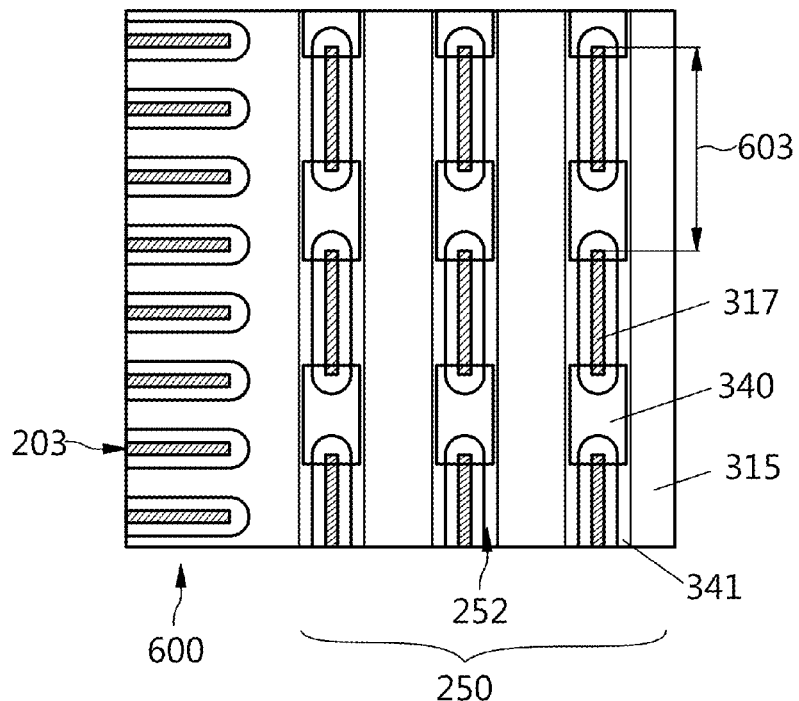
FIG. 5 is a schematic view of a layout of a switchable cell at or near of the edge termination region, according to an embodiment.

FIG. 5 illustrates a cell structure provided in an outer sub-region of the active area 10 which can form, for example, a third cell region 250. The edge termination region 600 at least partially surrounds the third cell region 250 of the active area 10. The third cell region 250 includes third switchable cells 252. The edge termination region 600 includes inactive cells 203. Furthermore, a longitudinal pitch 603 of a cell arrangement of the third switchable cells 252 in third cell region 250 of the active area is depicted.

Figure 6:
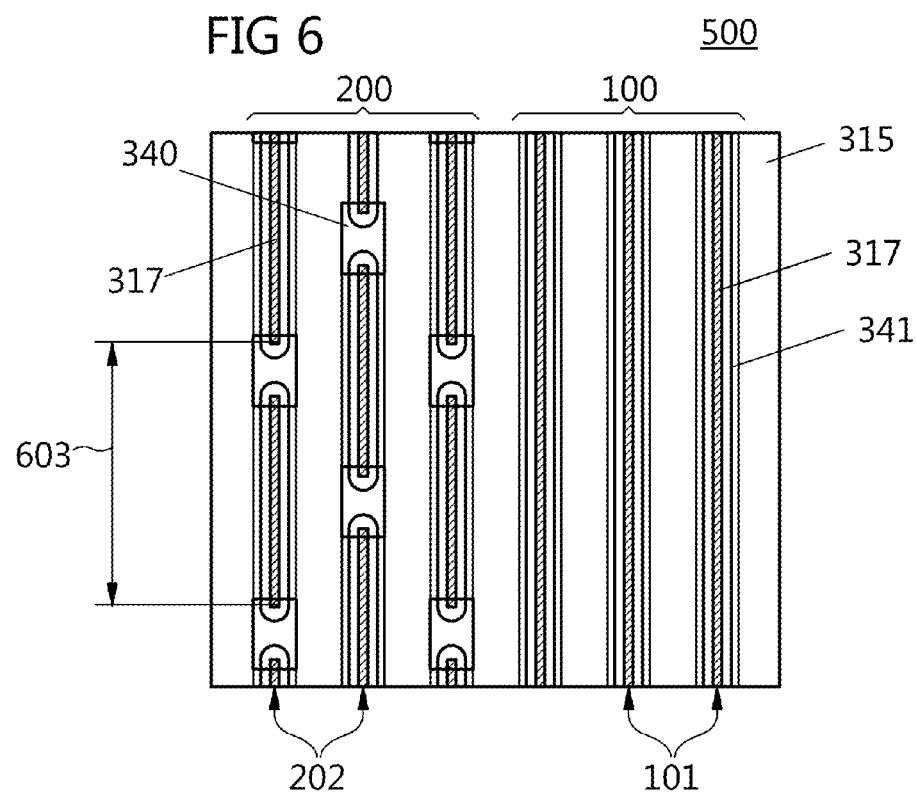
FIG. 6 is a schematic view of a layout of a switchable cell in a transition region between a first switchable region and a second switchable region, according to another embodiment.

FIG. 6 illustrates the cell structure in a transition region from the second switchable region 200 to the first or main cell region 100 which are provided in the active cell region 500.

As can be seen in FIGS. 5 and 6, the cell layout of the cell locally varies. For example, the longitudinal pitch 603 of the cells in the third cell region 250 can be smaller than the longitudinal pitch 603 in the second switchable region 200. The cell layout of the cells in the second and third cell region 200, 250 can be referred to a bar layout since the source contacts 317 have the shape of bars. Each source contact 317 lands on a single source region. The cells in the second switchable region 200 have longer source contacts 317 and longer source regions than the cells in the third cell region 250.

The source contacts 317 of the second cell area 200 and the third cell region 250 have a bar layout of different length. Therefore, this cell layout is often called "bar poly". As shown in FIGS. 5 and 6, the length of the source contacts 317 differs between the second to the third cell region 200, 250. The space between the bars—in their longitudinal extension—is covered by portions of the gate electrode structure 315 which therefore is larger in the third cell region 250 in comparison with the gate electrode structure 315 of the second switchable region 200, which in turn has a larger gate electrode structure 315 than the first switchable region 100.

The layout of the cells in first switchable region 100 can be described as a strip layout as only one continuous source region is formed per vertical line. Since the source contacts 317 form long strips and are typically formed by polysilicon contacts, this cell layout is also called "stripe poly."

The adaptation of the cell layer can also influence the channel width of switchable cell.

The area where the additional portions of the gate electrode 315 are formed is indicated by region 340. In regions 340, adjacent bars of the gate poly are connected to increase the coverage ratio of the gate electrode structure 315 relative to the area of the cells.

According to an embodiment, the longitudinal pitch of the cells is varied to reduce the channel width and the resistance of the gate electrode structure 315 in regions close to the gate metallization 305. Due to the increasing coverage of the gate electrode structure 315 closer to the gate metallization 305, the electrical resistance of the gate electrode structure 315 is also locally reduced which improves distribution of the gate signal. For example, the gate electrode structure 315 of the second switchable region 200 can have a lower specific resistance than the gate electrode structure 315 of the first switchable region 100.

FIG. 7 is another detailed illustration of second switchable cells 202 provided in the second switchable region 200 of the active cell region 500. As can be seen in FIG. 7, the second switchable cells 202 have a specific longitudinal pitch such that channel width and/or gate poly resistance of cells near chip edge is reduced. Thereby, transistor cells located near the chip edge are provided with a slower switching behavior, or a lower transconductance, or both, as compared to transistor cells located in the chip center, i.e. located further away from the chip edge. In other words, a faster or more aggressive switching is provided in the chip center or closer to the chip center.

FIG. 8 is for illustration of a shadowing mask 402 used for varying physical properties of the second switchable cells 202 in the second switchable region 200 of the active cell region 500, during manufacturing of the semiconductor switching device. The shadowing mask 402 illustrated in FIG. 8 can be positioned in the region of the second switchable cells 202, specifically over areas where a high polysilicon coverage is desired. The shadowing mask 402 is used to prevent the formation of source regions below the mask 402.

According to yet another embodiment which can be combined with embodiments described herein, the method further includes providing the first switchable region with a specific gate-drain capacitance which is different to a specific gate-drain capacitance of a second switchable region.

According to yet another embodiment, which can be combined with embodiments described herein, the method further includes providing the first switchable region with a first threshold and the second switchable region with a second threshold which is different to the first threshold. Herein, a body implantation dose of switchable cells located closer to the gate metallization can be higher than a body implantation dose of switchable cells located further away from the gate metallization. Specifically, the body implantation dose can be adjusted by adjusting an implantation opening during the cell formation process. In particular, the body region of switchable cells located closer to the gate metallization can have a higher p++ implantation than the body region of switchable cells located further away from the gate metallization (see FIG. 9B for example).

Figure 9A:
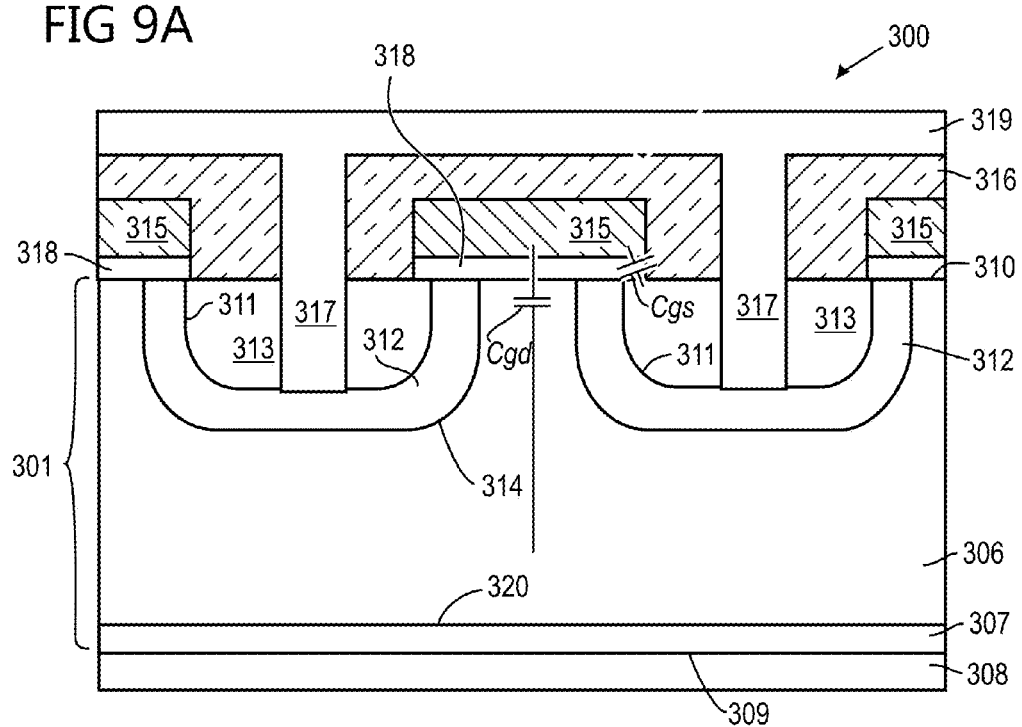
FIG. 9A is a side-sectional view of a portion of an array of switchable cells, according to an embodiment.

FIG. 9A is a cross-sectional view of a portion of a semiconductor device 300, wherein two adjacent switchable cells are illustrated.

The semiconductor substrate 301 has a first, upper side 310 and a second, lower side 309. At the second side 309 a drain region 307 is formed which is electrically connected to a drain metallization 308. A first pn-junction 314 is formed between a drift region 306 and a body region 312. The body region 312 can be provided as an p-doped region. A gate electrode structure 315 includes the gate electrodes and forms a gate-source capacitance $C_{GS}$ and a gate-drain capacitance $C_{GD}$. The body region 312 and a source region 313 are electrically connected by source contacts 317 with a source metallization 319 and are therefore at source potential in this embodiment. According to another embodiment, the body region 312 is not electrically connected to the source metallization 319 and thus floating. An area of the gate-source capacitance $C_{GS}$ assumes the laterally outer portions of the gate electrode 315, e.g. the area where the gate electrode structure 315 overlaps the source regions 313 and the field-free portions of the body regions 312, in which no space-charge region is formed. The field-free portions of the body regions 312 and the source regions 313 form the counter electrode of the gate-source-capacitance $C_{GS}$.

On the other hand, the central portion of the gate electrode structure 315 forms the gate-drain capacitance $C_{GD}$. The counter electrode is formed here by the field-free portions of the drift region 306, e.g. the portions of the drift region 306 which are below the space-charge region. The "capacitor dielectric layer" of the gate-drain capacitance $C_{GD}$ is formed by a dielectric dielectric layer 318 and the space-charge region.

As shown in FIG. 9A, the gate-drain capacitance $C_{GD}$ can be dependent on the specific coverage ratio between the area of the gate electrode structure 315 and the area of the semiconductor substrate. It is noted here that the active area can include both the area of the first switchable region 100 and the area of the second switchable region (see, e.g. FIGS. 2 and 4). Herein, the specific coverage ratio of the gate electrode structure 315 can be higher in regions of the active area which are located closer to the gate metallization than in regions of the active area which are located further away from the gate metallization.

Figure 9B:
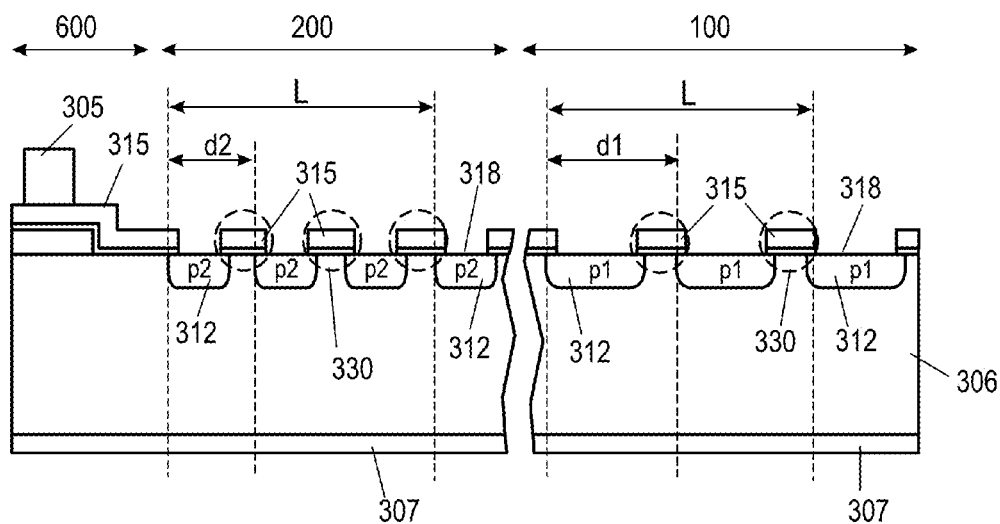
FIG. 9B is a side-sectional view of a portion of an array of switchable cells, according to another embodiment.

This is schematically illustrated in FIG. 9B which shows a cross-section through a semiconductor device according to an embodiment. FIG. 9B shows the active area with the first switchable region 100, which is the central cell region of the active area, and the second switchable region 200 of the active area formed by the first and second switchable region 100, 200. The second switchable region 200 surrounds the first switchable region 100.

As can be seen in FIG. 9B, the gate electrode structure 315 extends from the first switchable region 100 to the edge termination region 600. The gate metallization 305, specifically a gate ring, is formed in the edge termination region 600 on and in contact with the gate electrode structure 315. Additional gate fingers can also be formed in contact with the gate electrode structure 315 to extend from the gate ring 305 into the second switchable region 200.

The lateral pitch of the switchable cells in the first and second switchable region 100, 200 is indicated by the arrows marked with d1 and d2, respectively. Arrow L indicates the length of a "unit region" which is used here to explain the variation of the specific coverage ratio. For sake of ease of explanation, FIG. 9B only illustrates the body regions.

As can be seen in FIG. 9B, the gate electrode structure 315 covers a larger portion in the second cell area 200 than in the first cell area 100. More specifically, the coverage ratio between the gate electrode structure 315 and the drift region 306 is larger in the second switchable region 200 than in the first switchable region 100. This locally increases the gate-drain capacitance $C_{GD}$ in the second switchable region 200 in comparison to first switchable region 100.

The regions covered by the gate electrode structures and arranged between adjacent body regions 312 is marked by circles 330. As shown in FIG. 9B, due to the shorter cell pitch d1, the number of covered regions 330 is larger in the second switchable region 200 per unit region L than in the first switchable region 100.

Figure 10:
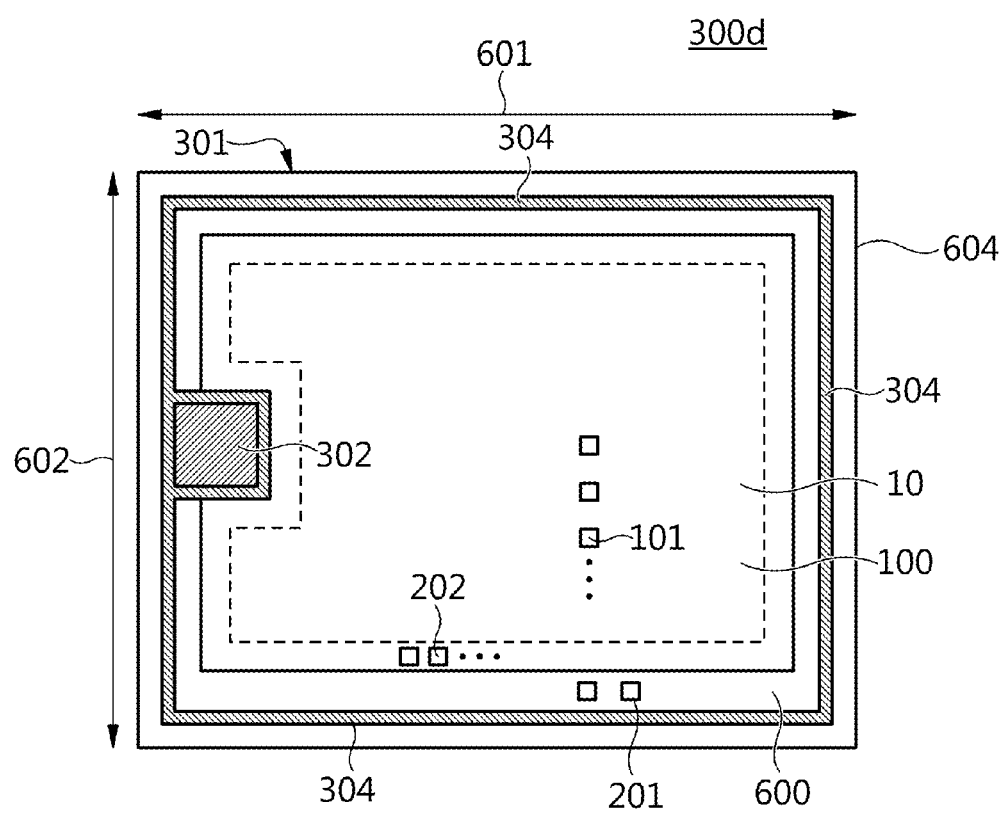
FIG. 10 illustrates a semiconductor switching device having a first switchable region and a second switchable region arranged between the first switchable region and an edge termination region, according to another embodiment.

FIG. 10 illustrates a semiconductor switching device 300d having a first switchable region 100 and a second switchable region 200 arranged between the first switchable region 100 and the edge termination region 600, according to another embodiment which can be combined with other embodiments described herein. Specifically, the active area 10 can include the first switchable region 100 having first switchable cells 101 and the second switchable region 200 having second switchable cells 202, wherein the second switchable region 200 at least partially surrounds the first switchable region 100. The first switchable region 100, or the main cell region, includes main or first switchable cells 101, whereas the second switchable region 200 includes sub-region cells 202, or second cells.

As illustrated in FIG. 10, the second switchable region 200 is arranged near or adjacent to the edge termination region 600. As the gate metallization 305 formed, e.g. by the gate ring 304 and the gate pad 302, is arranged within in the edge termination region 600, switchable cells 202 arranged in the second switchable region 200 can receive switching signals in a shorter time period than the first switchable cells 101 located in the main cell region 100. A physical dimension of the semiconductor substrate can be defined by a substrate length 601 and by a substrate width 602. The substrate length can be in a range from 5 mm to 15 mm, and typically amounts to approximately 10 mm. The substrate width can be in a range from 4 mm to 10 mm, and typically amounts to approximately 7 mm.

Figure 11:
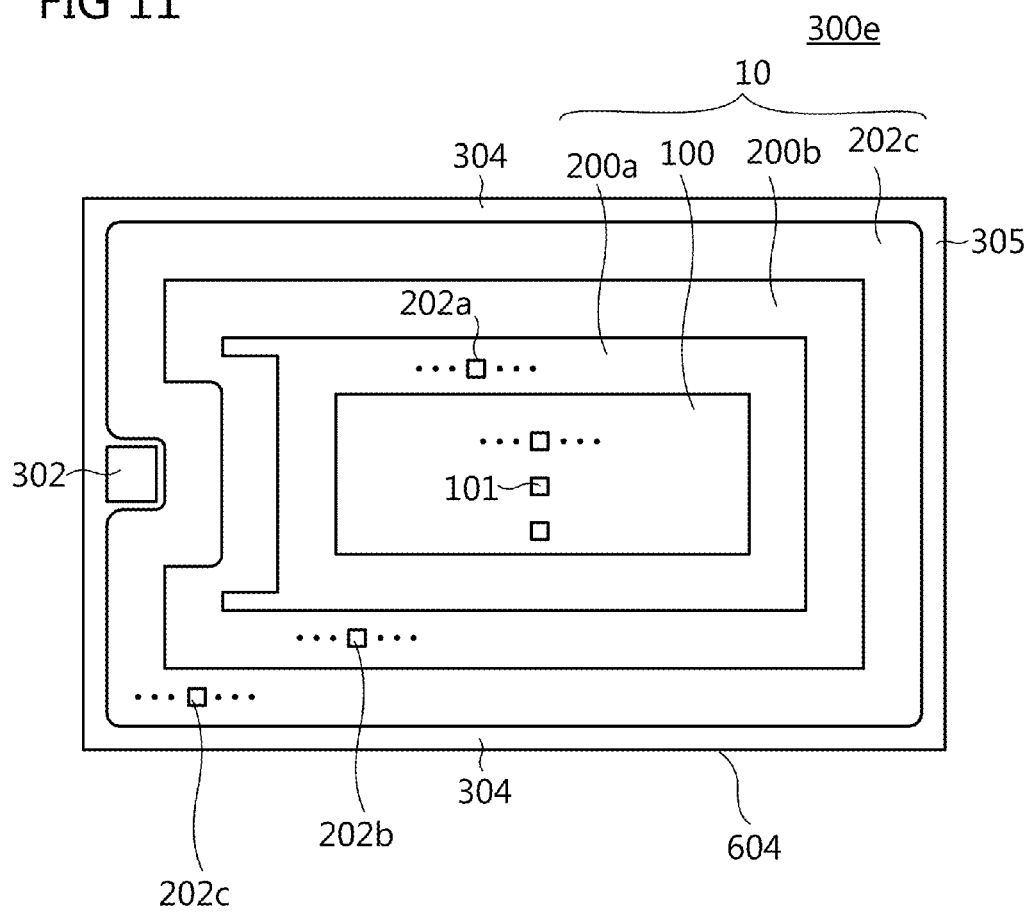
FIG. 11 illustrates a semiconductor switching device having a first switchable region, a second switchable region, a third switchable region, and a fourth switchable region, according to yet another embodiment.

FIG. 11 illustrates a semiconductor switching device 300e having a plurality of switchable regions 100, 200a, 200b, according to yet another embodiment which can be combined with embodiments described herein.

In the arrangement shown in FIG. 11, the first switchable region 100 of the active area 10 can include switchable cells 101 having a first transconductance. The second switchable region 200a of the active area 10 at least partially surrounds the first switchable region 100 and can include switchable cells 202a having a second transconductance. The third switchable region 200b of the active area 10 at least partially surrounds the second switchable region 200a and can include switchable cells 202b having a third transconductance. Furthermore, the fourth switchable region 200c of the active area 10 at least partially surrounds the third switchable region 200b and can include switchable cells 202c having a fourth transconductance. Each of the first to fourth switchable region can have a different transconductance, the transconductance can thus change step-wise from the first switchable region 100 to the fourth switchable region 200c, for example, can increase step-wise or can alternatively decrease step-wise.

In view thereof, the active area can include a first switchable region 100 of first switchable cells 101, each first switchable cell 101 having a first transconductance, and a second switchable region 200a of second switchable cells 202a, each second switchable cell 202a having a second transconductance, and a at least a third cell region 200b of third switchable cells 202b, each third switchable cell 202b having a third transconductance, wherein the third transconductance is lower than the second transconductance, the second transconductance is lower than the first transconductance, and the second switchable region 200a is arranged between the first switchable region 100 and the third cell region 200c. Alternatively, the third transconductance is higher than the second transconductance, and the second transconductance is higher than the first transconductance.

It is possible to vary the transconductance while keeping the threshold voltage and the gate-drain capacitance of the cells constant or to vary the transconductance and at least one of the gate-drain capacitance and the threshold voltage.

Detailed structures of switchable cells obtained during manufacturing processes for switchable cells and an explanation of individual method steps are described herein below with reference to FIGS. 14A, 14B to 23A, 23B. The manufacturing process provides the possibility for an adjustment of channel widths of individual cells such that an overall switching behavior of the semiconductor switching device can be improved. An adjustment of the channel widths leads to a different cell layout which in turn results in different transconductances of individual cells. The transconductance of a switchable cell can correspond to, in a small-signal circuit analysis, the ratio of the output current of a switchable cell as compared to the input voltage of this switchable cell. This ratio can be regarded as "slope", "steepness", or transconductance of a switchable cell.

In FIG. 14A and FIG. 14B two cell layouts are illustrated, wherein the cell layouts have different channel widths 403. An adjustment of the channel widths 403 is performed by applying appropriate shadowing masks 402, which are also referred to as auxiliary implantation mask, as will be described herein below. The manufacturing processes are illustrated herein below with reference to FIG. 16A to FIG. 23B.

The gate electrode structure 315 is formed before source implementation and formation of source contacts 317. Each source contact 317 lands on a single source region 313. As shown in FIGS. 14A and 14B, the source regions 313 are longer in FIG. 14A as compared to the source regions 313 in FIG. 14B. The shadowing masks (auxiliary implantation mask) 402 are designed such that a width of the source regions 313 can be influenced. Thereby, an entire implementation mask is provided by a combination of the gate electrode structure 315 and the shadowing masks 402. The channel width 403 defined by the shadow mask 402 indicates the width of the source regions 313.

Figure 15:
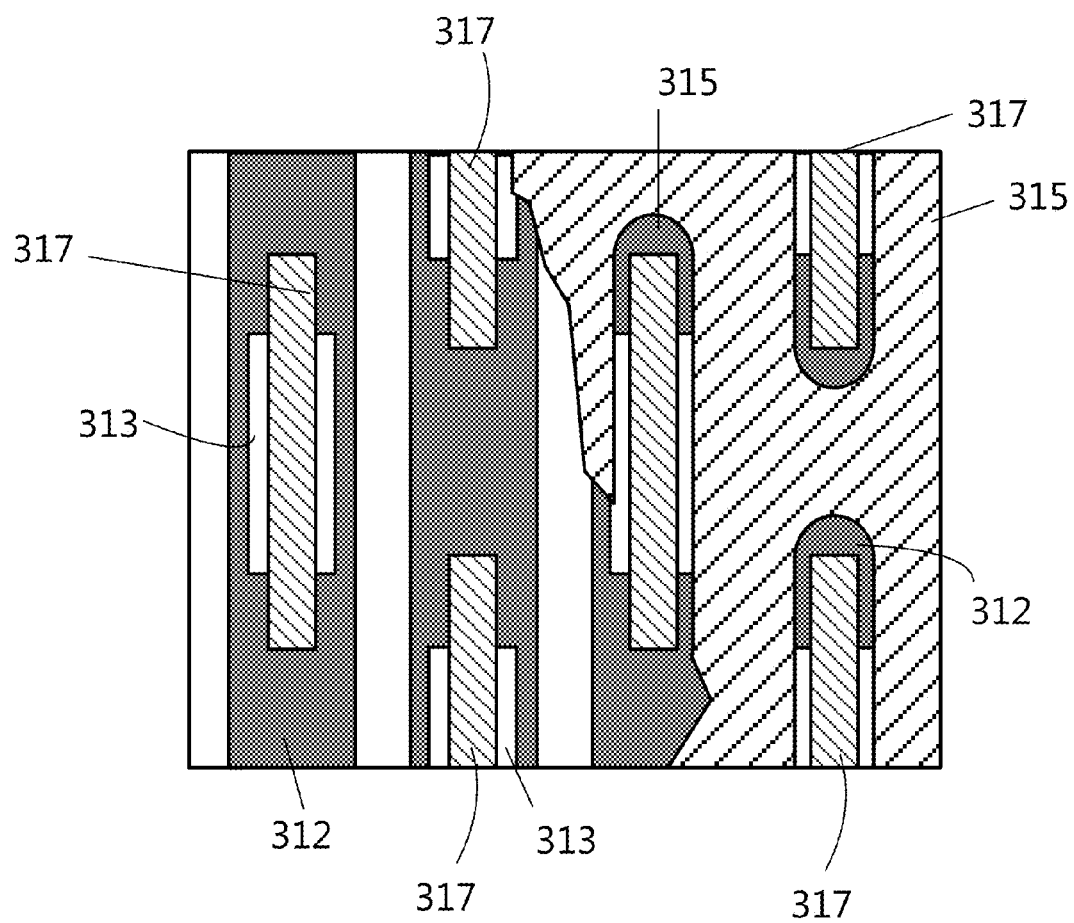
FIG. 15 shows the arrangement of individual cells of a semiconductor switching device, from a top view, according to an embodiment.

FIG. 15 is a top view of a cell layout with a partially cut-away gate electrode structure 315. As shown on the left side of FIG. 15, the source contact 317 contacts the source region 313 and the body region 312.

In the following, manufacturing processes for forming switchable cells having a specific cell layout will be illustrated with respect to FIG. 16A to FIG. 23B. Figures marked by "A" are top views onto a portion of the active area while Figures marked by "B" are a cross sectional view of the active cell area along the dashed line A-A of the Figures marked by "A".

A dielectric layer 318 forming a gate dielectric and a gate electrode layer 315 forming later the gate electrode structure 315 are arranged in this order on the surface of a semiconductor substrate 301 which includes the drift region 306. According to an embodiment described herein, the drift region 306 can be provided as an n-doped region. An etching mask 405 is formed on the gate electrode layer 315. The gate electrode layer 315 can be a highly-doped polysilicon layer.

The etching mask 405 has openings 405a, i.e. regions which are not covered by the etching mask 405. In correspondence to the structure of the etching mask 405, dielectric layer 318 and gate electrode layer 315 are etched to expose the drift region 306 in regions of the openings 405a. The etched gate electrode layer forms the gate electrode structure 315.

Figure 16A:
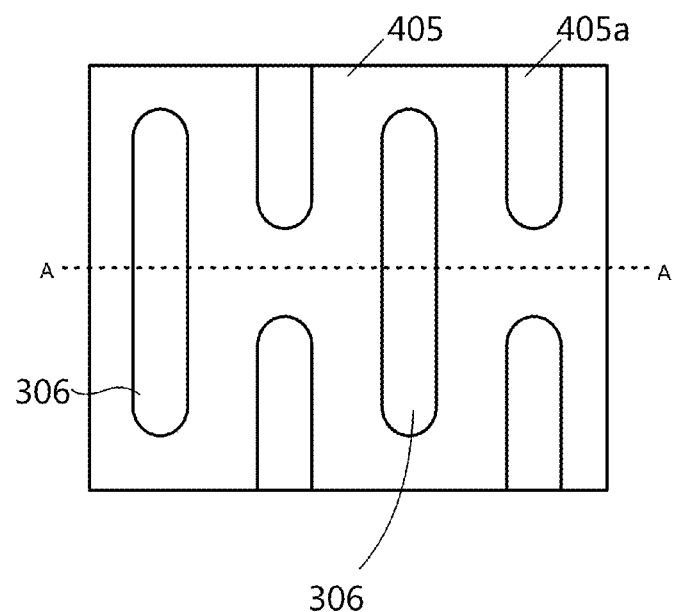
FIG. 16A and FIG. 16B illustrate processes for forming a dielectric layer and a gate electrode structure of a semiconductor switching device, according to an embodiment.
Figure 16B:
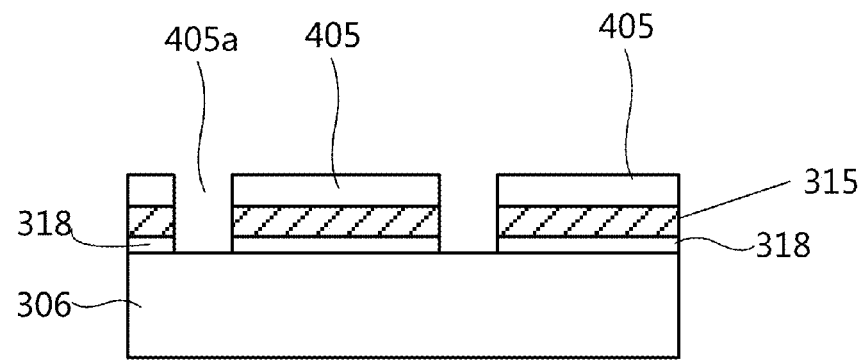
Figure 17A:
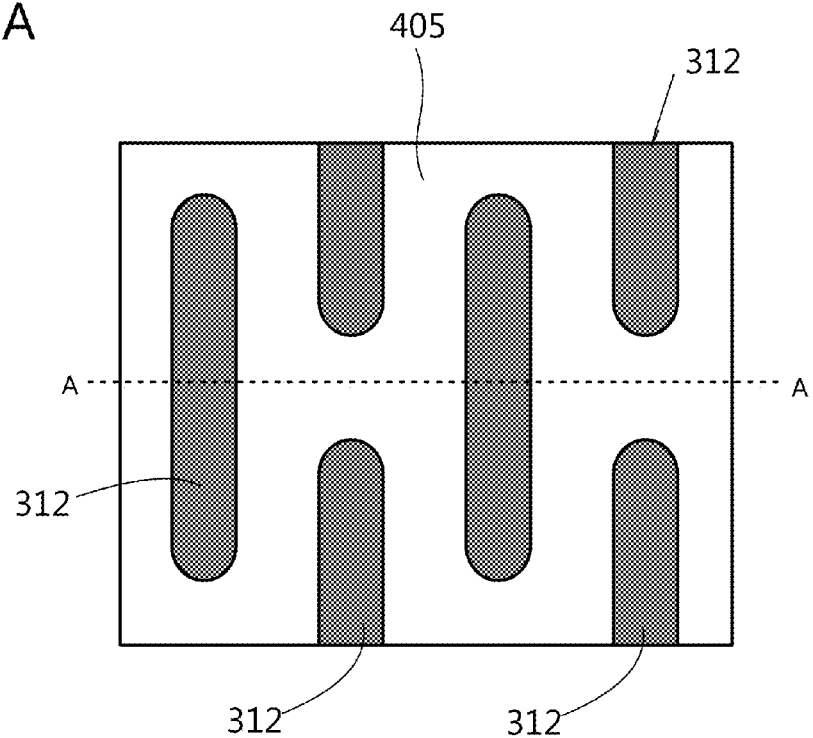
FIG. 17A and FIG. 17B illustrate processes for forming body regions of a semiconductor switching device, according to an embodiment.
Figure 17B:
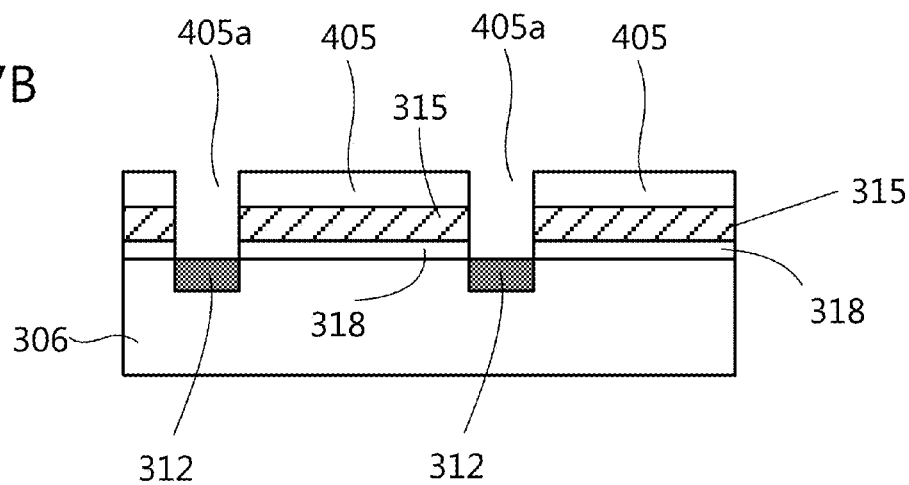

FIG. 17A and FIG. 17B illustrate a subsequent manufacturing process after the processes shown in FIGS. 16A and 16B.

Figure 18A:
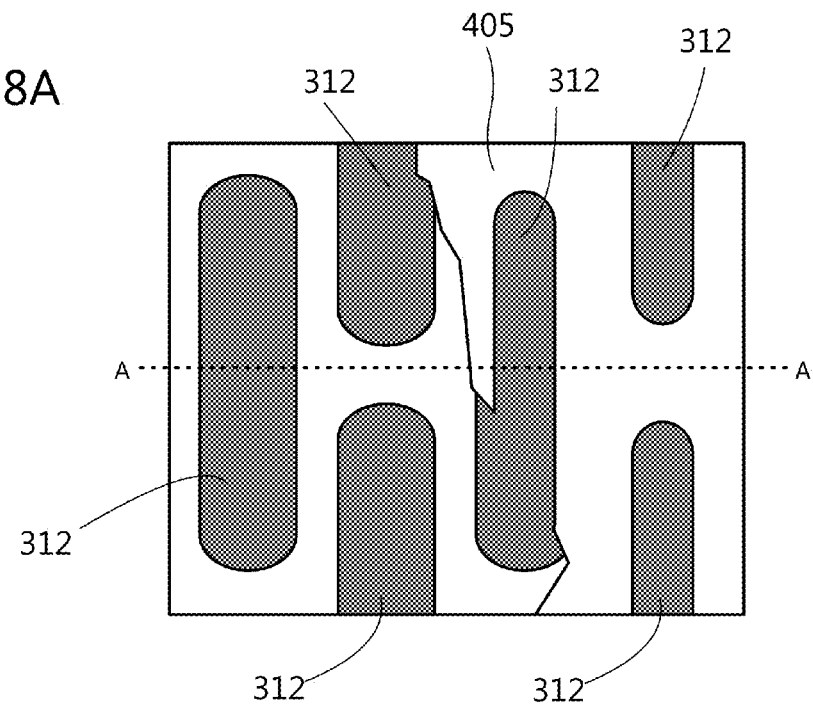
FIG. 18A and FIG. 18B illustrate further processes for forming body regions of a semiconductor switching device, according to an embodiment.
Figure 18B:
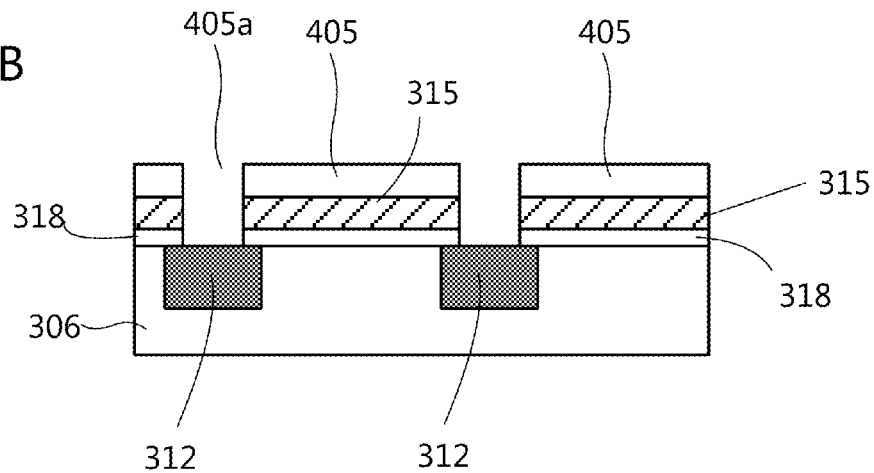

As shown in FIG. 17A, body regions 312 are formed by implanting dopants through the openings 405a of the etching mask 405 and into the drift regions 306. In a further process, the body regions 312 are diffused into the drift region 306 as illustrated in FIG. 18A and FIG. 18B. As can be seen in FIG. 18A, left side, and from FIG. 18B, the body regions 312 are diffused vertically and laterally into the drift regions 306. Thereby, a lateral extension of the body regions 312 can exceed the lateral width of the opening 405a and the respective openings formed in the gate dielectric layer 318 and the gate electrode structure 315. The body regions 312 are typically p-doped body regions 312. The etching mask 405 also functions as implantation mask. The body-implantation forms a first implantation process.

Figure 19A:
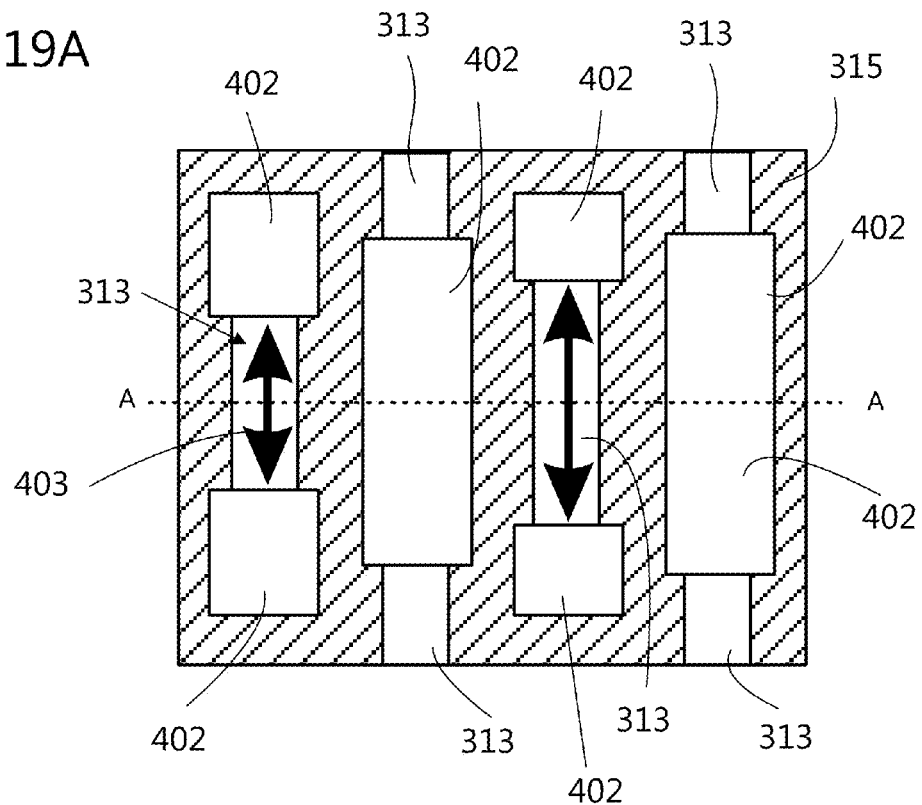
FIG. 19A and FIG. 19B illustrate processes for forming source regions of a semiconductor switching device, according to an embodiment.
Figure 19B:
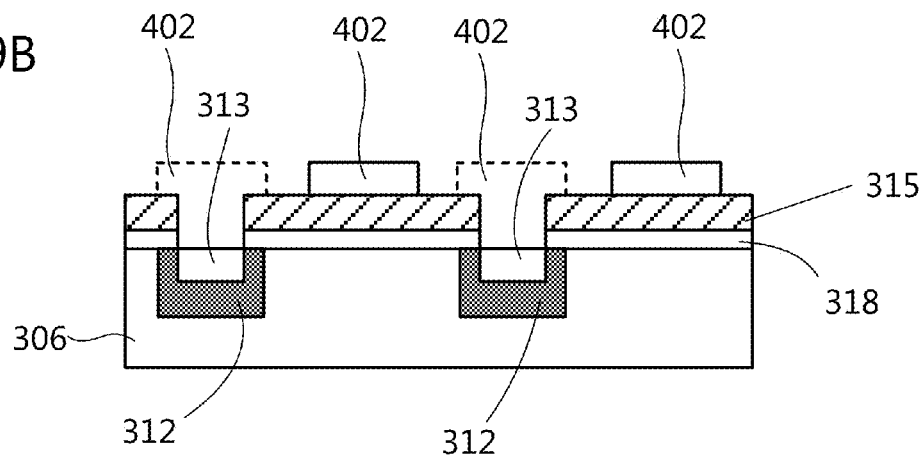

Further processes are illustrated in FIG. 19A and FIG. 19B. After the body region 312 has been diffused into the n-doped drift region 306, an auxiliary implantation mask 402, which forms a shadowing mask, is formed onto the gate electrode structure 315 after removal of the etching mask 405. Alternatively, the etching mask 405 is not removed and the auxiliary implantation mask 402 is formed on the etching mask 405. The auxiliary implantation mask 402 defines the channel width of the respective switchable cell by defining the width of the source region of the respective switchable cell. Thus, a channel width 403 of individual cells of the semiconductor switching device can be adjusted.

Source regions 313 are then formed by implanting dopants through the uncovered parts of the openings 405a in the etching mask 405. The etching mask 405 and the auxiliary implantation mask 402, or the gate electrode structure 315 and the auxiliary implantation mask 402, form a common implantation mask for the source implantation, which is a second implantation process. As the gate electrode structure 315 is etched in previous processes relative to the etching mask 405, see FIGS. 16A and 16 B, the gate electrode structure 315 can also be regarded as an implantation mask having openings which are decreased in length by applying the auxiliary implantation masks 402.

As shown in FIG. 19A, the channel width defines the length of the strip of the source region 313. As an example, the channel width is indicated by an arrow 403 in FIG. 19A.

Figure 20A:
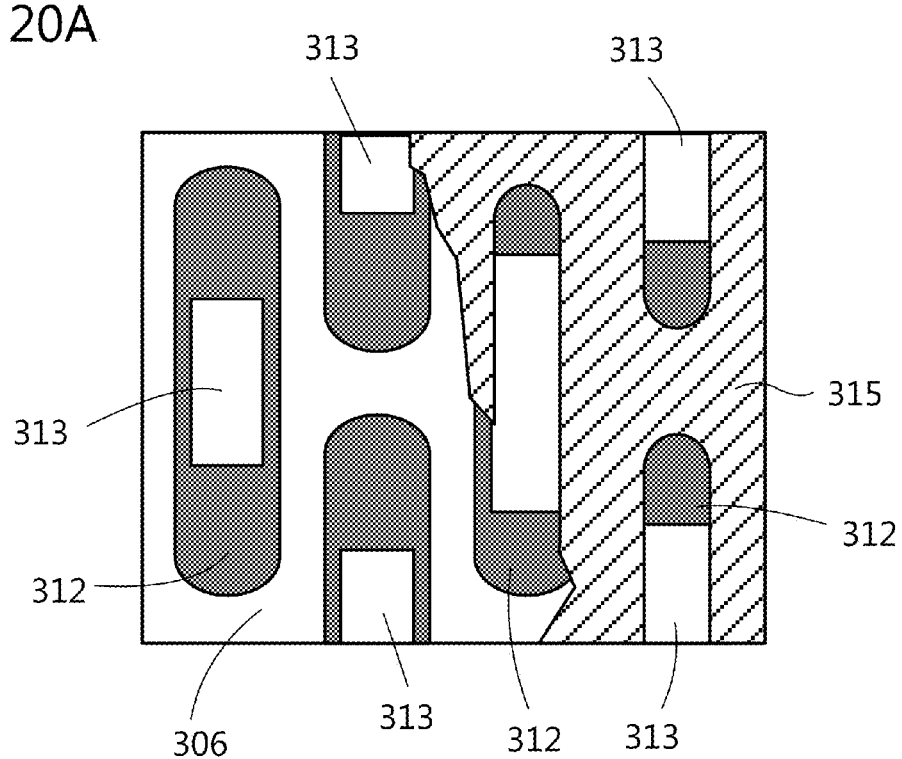
FIG. 20A and FIG. 20B illustrate further processes for forming source regions of a semiconductor switching device, according to an embodiment.
Figure 20B:
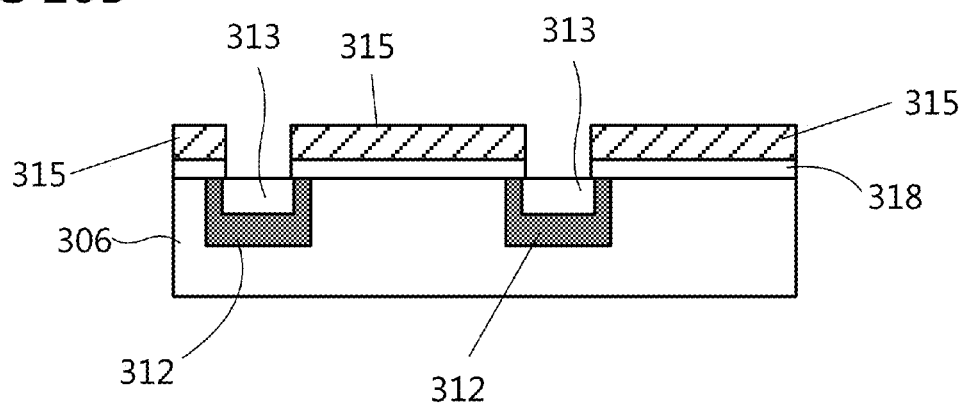

FIG. 20A and FIG. 20B illustrate a further process where both the source regions 313 and the body regions 312 are further diffused vertically and laterally into the drift region 306 to form a doubly diffused MOSFET. As depicted, the body region 312 and the source region 313 are broaden to some extent as compared to the situation of the previous processing step depicted in FIG. 19A and FIG. 19B.

Figure 21A:
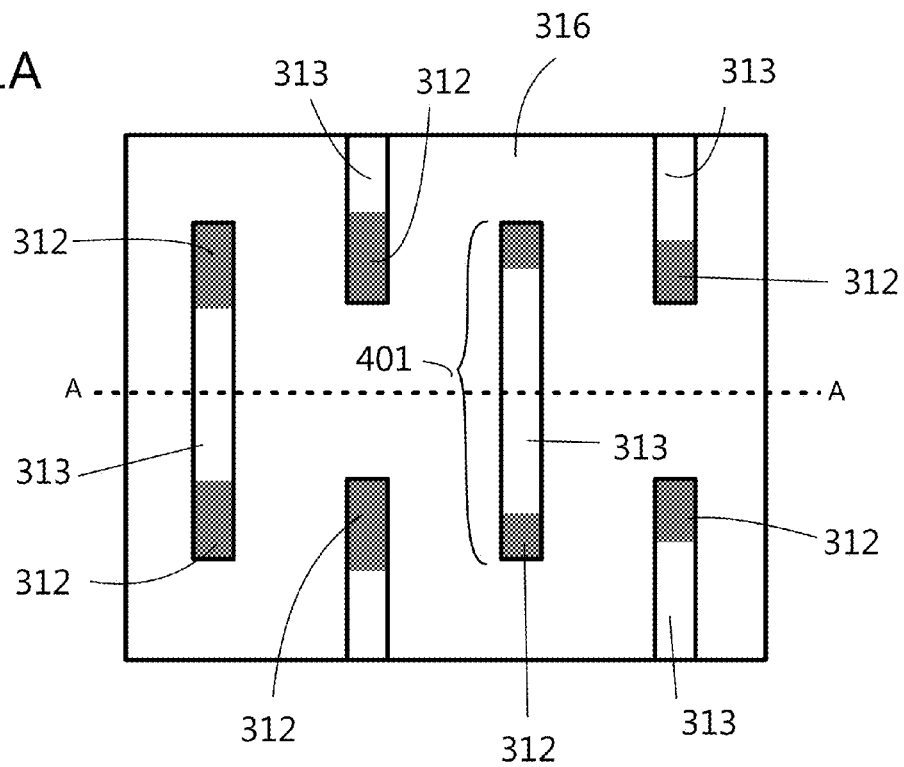
FIG. 21A and FIG. 21B illustrate processes for forming source contact openings of a semiconductor switching device, according to an embodiment.
Figure 21B:
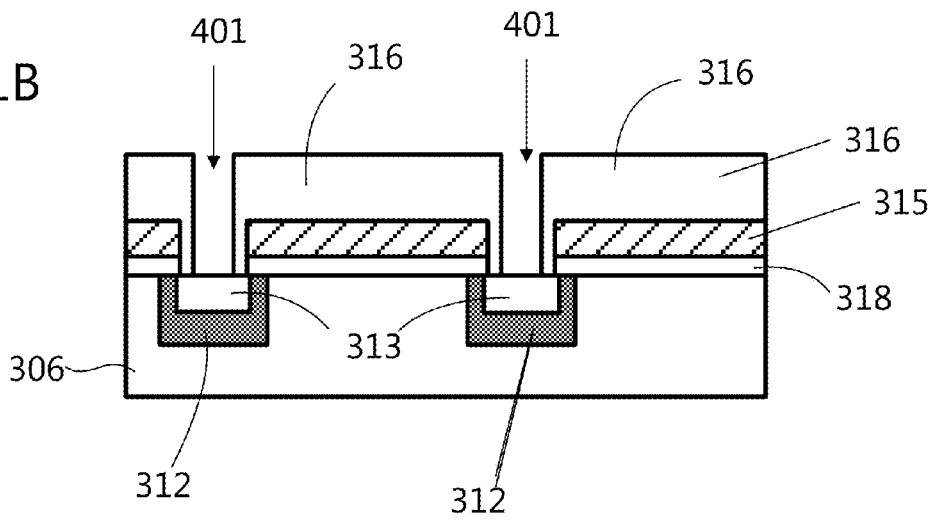

Then, in further processes which are illustrated in FIG. 21A and FIG. 21B, an insulation layer 316 is deposited. The insulation layer 316, which can be a $SiO_2$ layer, is deposited onto the gate electrode structure 315. After deposition of the insulation layer 316 the contact holes indicated at 401 are formed in the insulation layer 316. The contact holes 401 form an access from above to the upper surface of the source regions 313 and body regions 312. The contact hole 401 can extend in its length over the respective body region 312 and the source region 313.

Figure 22A:
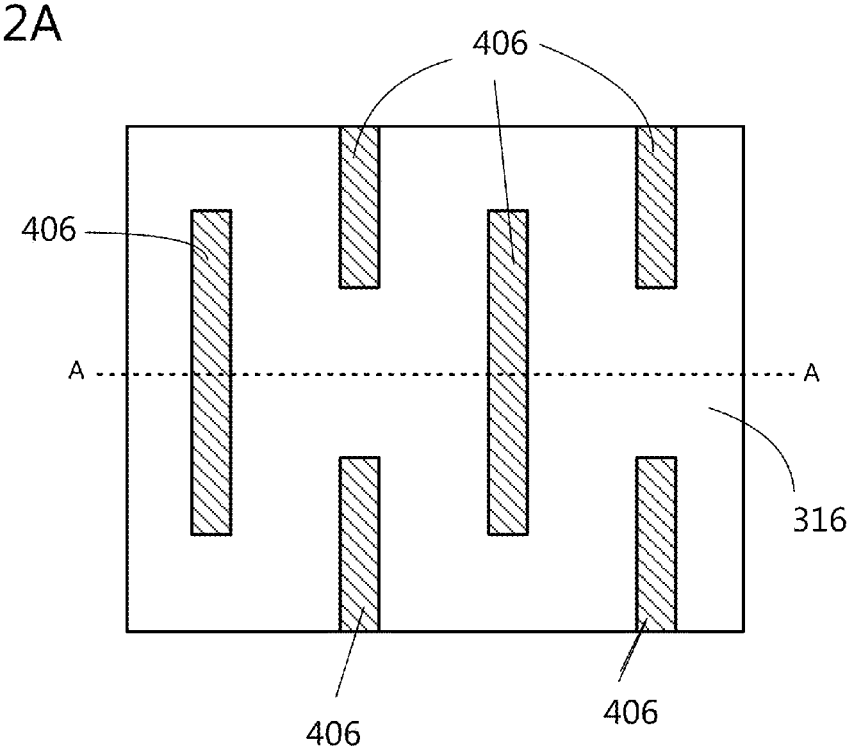
FIG. 22A and FIG. 22B illustrate processes for forming source contacts of a semiconductor switching device, according to an embodiment.
Figure 22B:
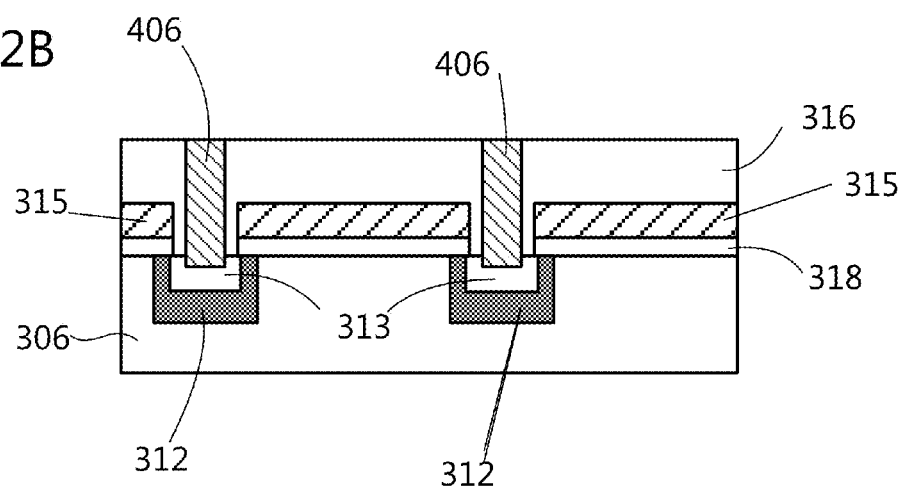

In further processes, as shown in FIG. 22A and FIG. 22B, source/body contacts are formed in the contact holes 401. These contacts are provided as plugs or contacts 406 and are used for contacting the source regions 313 and the body regions 312 to a later formed source metallization.

Figure 23A:
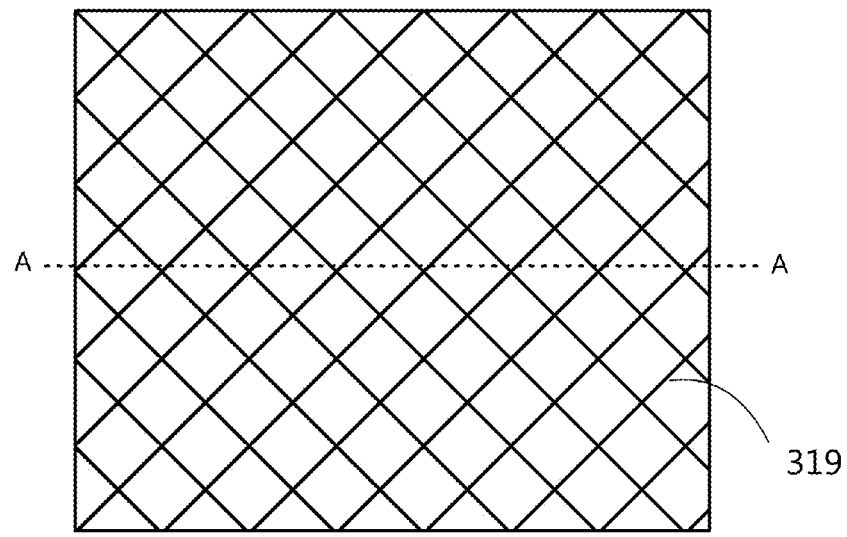
FIG. 23A and FIG. 23B illustrate processes for forming a source metallization of a semiconductor switching device, according to an embodiment.
Figure 23B:
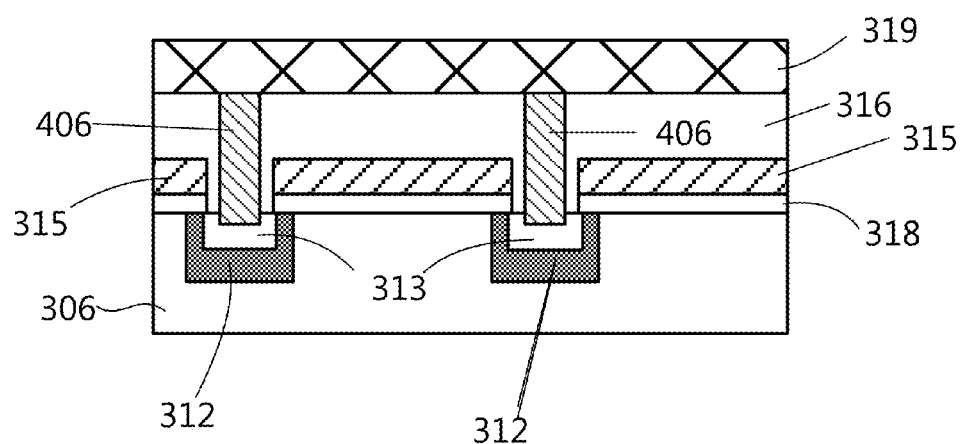

In further processes, which are illustrated in FIGS. 23A and 23B, a source metallization 319 is deposited onto the insulation layer 316.

Further layouts of switchable cells 101 arranged in the active area 10 of a semiconductor switching device 300 are illustrated in FIG. 26 to FIG. 30. As described before, the switchable cells 101 can have different cell layout and thus, different electrical properties throughout the semiconductor chip 300.

FIG. 26 illustrates a semiconductor switching device 300 arranged on a semiconductor substrate 301, according to end embodiment.

As shown in FIG. 26, switchable cells 101 have a different cell layout as compared to switchable cells 202 which are of included in the second switchable region 200, see FIG. 26, lower left the region. The active area 10 which includes both the first switchable region 100 and the second switchable region 200, is surrounded by the edge termination region 600. The edge termination region 600 is arranged between the active area 10 and the outer rim (not shown in FIG. 26). Gate signals for the individual switchable cells 101, 202 are provided via the gate pad 302. The second switchable cells 202 can have a cell layout having a channel width which is increased as compared to a channel width of the first switchable cells 101.

FIG. 27 illustrates a semiconductor switching device 300 formed in the semiconductor substrate 301, according to another embodiment. As shown in FIG. 27, the active area 10 includes a number of switchable regions 100, 200a, 200b surrounded by the edge termination region 600. Each of the switchable regions 100, 200a, 202b can include switchable cells having a cell layout with an increasing channel width from the first switchable region 100 to the third switchable region 200b.

Figure 28:
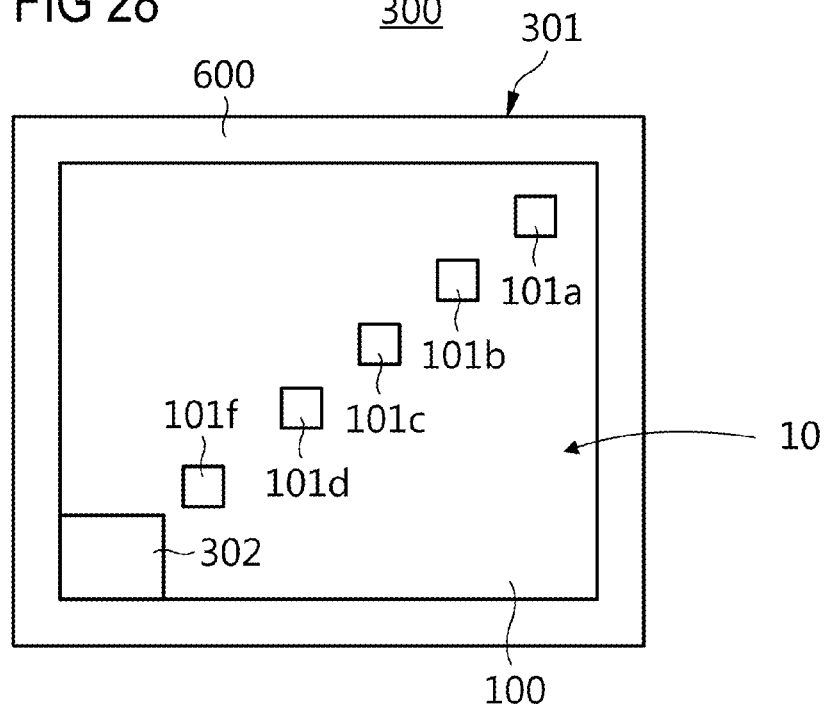
FIG. 28 illustrates a semiconductor switching device having first and second switchable cells in yet another arrangement, according to another embodiment.

FIG. 28 is an illustration of yet another semiconductor switching device 300, according to an embodiment. As shown in FIG. 28, a number of different switchable cells 101a, 101b, 101c, . . . 101f are arranged within the active area 10. The layout of the switchable cells 101a, 101b, 101c, ... 101f can be adapted according to the distance with respect to the gate pad 302. Thereby, switchable cells 101f being closer to the gate pad 302 can be provided with channels having a channel width which is larger than a width of switchable cells 101a located further away from the gate pad 302. In addition to that, or alternatively, switchable cells 101 can be mixed with inactive 203 in the active area 10. Hereby, the density of interactive cells 203 can be increased at locations near the gate pad 302, and can be decreased further away from the gate pad 203.

Therefore, according to an embodiment, the active area 10 includes inactive cells 203, wherein the area covered by the inactive cells 203 per unit area is larger in regions of the active area 10 close to the gate signal emitter than in regions of the active area 10 arranged further away from the gate signal emitter. When describing the density of the inactive cells 203 by an "inactive ratio" defined by the area covered by the inactive cells per unit area, the inactive ratio decreases with increasing distances from the gate signal emitter.

Figure 29:
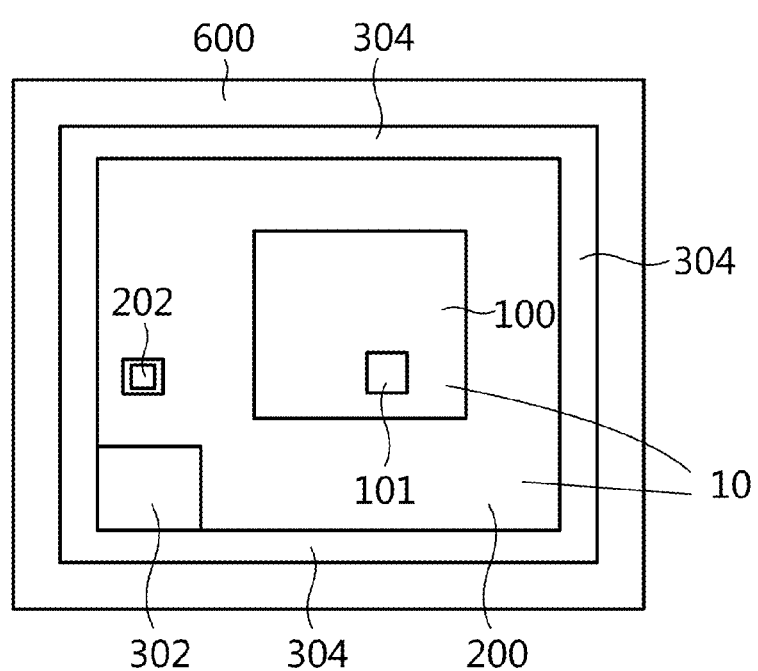
FIG. 29 illustrates a semiconductor switching device having an active cell area subdivided into regions with different switchable cells, according to yet another embodiment.

FIG. 29 illustrates a semiconductor switching device 300 having a first switchable region 100 and a second switchable region 200. The switchable region 100 includes switchable cells 101, whereas the second switchable region 200 includes second switchable cells 202. In addition to the cell structure shown in FIG. 28, the semiconductor switching device 300 shown in FIG. 29 includes a gate ring 304 connected to the gate pad 302.

Figure 30:
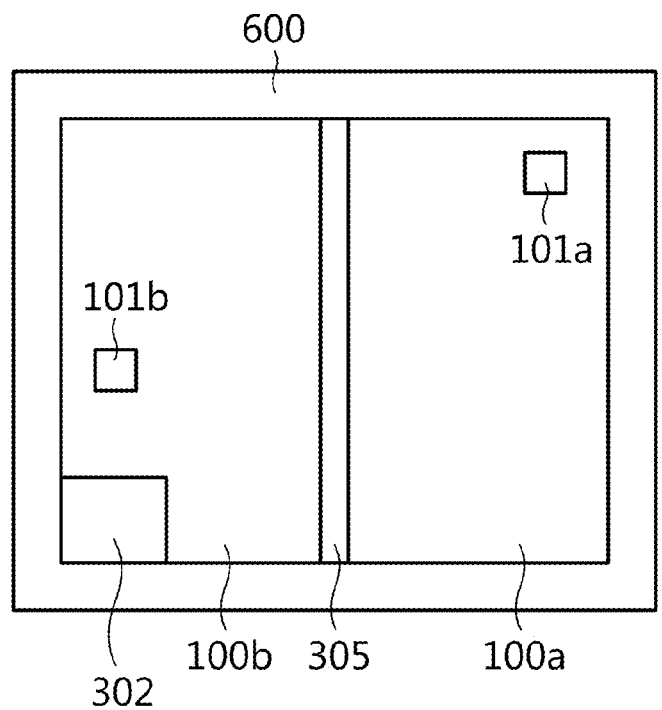
FIG. 30 illustrates a semiconductor switching device wherein the active area is subdivided into two cell areas with different cell layout, according to yet another embodiment.

FIG. 30 illustrates yet another embodiment of a semiconductor switching device 300 having switchable cells 101a, 101b, etc. In addition to the arrangement shown in FIG. 29, the semiconductor switching device 300 shown in FIG. 30 includes a gate runner 305 such that a transfer of gate signals to switchable cells in the active cell region can be improved.

Providing the switchable cells which are arranged closer to the gate metallization with a larger channel width increases the slope dv/dt of these cells. As the switchable cells arranged closer to the gate metallization are switched first, for example due to the lower total gate resistance which these cells "see", the switchable cells close to the gate metallization are switched-on and off first.

Upon switching-on, the increased slope dv/dv of the switchable cells arranged closer to the gate metallization increase the average slope of all switchable cells. Different thereto, as the switchable cells arranged closer to the gate metallization are turned-off first, they do not contribute to the switching behavior after turning off. This means that the turning-off switching behavior of the mainly defined by the switchable cells arranged further away from the gate metallization. This allows independent tailoring of the slope dv/dt for the switching-on and the switching-off. The increased slope dv/dt upon switching-on reduces unwanted losses while the reduced slope dv/dt upon switching-off does not cause a steep increase of the hole current.

Spatially relative terms such as "under," "below," "lower," "over," "upper" and the like, are used for ease of description to explain the positioning of one element relative to a second element. These terms are intended to encompass different orientations of the device in addition to different orientations than those depicted in the Figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above can be combined with each other. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the features of the various example embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate comprising an outer rim, a plurality of switchable cells defining an active area, and an edge termination region arranged between the switchable cells defining the active area and the outer rim, wherein each of the switchable cells comprises a body region, a gate electrode structure and a source region;
a source metallization in ohmic contact with the source regions of the switchable cells; and
a gate metallization in ohmic contact with the gate electrode structures of the switchable cells,
wherein the active area defined by the switchable cells comprises at least a first switchable region having a first transconductance and at least a second switchable region having a second transconductance which is different from the first transconductance
wherein the second switchable region is arranged between the gate metallization and the first switchable region, wherein the second transconductance of the second switchable region is lower than the first transconductance of the first switchable region, and
wherein a ratio of the area of the second switchable region to the total area of the switchable regions is in a range from 5% to 50%.

2. The semiconductor device of claim 1, wherein the transconductance changes step-wise from a sub-area of the active area close to the gate metallization to a center of the active area further away from the gate metallization.

3. The semiconductor device of claim 1, wherein the plurality of switchable cells comprises at least one transistor selected from the group consisting of a MOSFET, a MISFET, an IGBT, a SJFET, and any combinations thereof.

4. The semiconductor device of claim 1, wherein each switchable cell has a given transconductance, wherein a first group of switchable cells defines the first switchable region and a second group of switchable cells different to the first group of switchable cells defines the second switchable region.

5. The semiconductor device of claim 1, wherein the gate electrode structure comprises a highly-doped polycrystalline semiconductor material and the gate metallization comprises a metal layer or a metal layer stack.

6. The semiconductor device of claim 1,
wherein the active area defined by the switchable cells comprises at least the first switchable region, at least the second switchable region, and at least a third switchable region having a third transconductance which is different from each of the first transconductance and the second transconductance,
wherein the third switchable region is arranged between the gate metallization and the second switchable region,
wherein the third transconductance of the third switchable region is lower than the second transconductance of the second switchable region, and
wherein a ratio of the total area of the second and third switchable region to the total area of the first, second and third switchable region is in a range from 5% to 50%.

7. A semiconductor device, comprising:
a semiconductor substrate comprising an outer rim, a plurality of switchable cells defining an active area, and an edge termination region arranged between the switchable cells defining the active area and the outer rim, wherein each of the switchable cells comprises a body region, a gate electrode structure and a source region;
a source metallization in ohmic contact with the source regions of the switchable cells; and
a gate metallization in ohmic contact with the gate electrode structures of the switchable cells,
wherein the active area defined by the switchable cells comprises at least a first switchable region having a first transconductance and at least a second switchable region having a second transconductance which is different from the first transconductance,
wherein the second switchable region is arranged between the gate metallization and the first switchable region,
wherein the second transconductance of the second switchable region is higher than the first transconductance of the first switchable region, and
wherein a ratio of the area of the second switchable region to the total area of the switchable regions is in a range from 5% to 50%.

8. The semiconductor device of claim 7,
wherein the active area defined by the switchable cells comprises at least the first switchable region, at least the second switchable region, and at least a third switchable region having a third transconductance which is different from each of the first transconductance and the second transconductance,
wherein the third switchable region is arranged between the gate metallization and the second switchable region,
wherein the third transconductance of the third switchable region is higher than the second transconductance of the second switchable region, and
wherein a ratio of the total area of the second and third switchable region to the total area of the first, second and third switchable region is in a range from 5% to 50%.

9. The semiconductor device of claim 7, wherein the transconductance changes step-wise from a sub-area of the active area close to the gate metallization to a center of the active area further away from the gate metallization.

10. The semiconductor device of claim 7, wherein the plurality of switchable cells comprises at least one transistor selected from the group consisting of a MOSFET, a MISFET, an IGBT, a SJFET, and any combinations thereof.

11. The semiconductor device of claim 7, wherein each switchable cell has a given transconductance, wherein a first group of switchable cells defines the first switchable region and a second group of switchable cells different to the first group of switchable cells defines the second switchable region.

12. The semiconductor device of claim 7, wherein the gate electrode structure comprises a highly-doped polycrystalline semiconductor material and the gate metallization comprises a metal layer or a metal layer stack.

13. A semiconductor device, comprising:
a semiconductor substrate comprising an outer rim, a plurality of switchable cells defining an active area, and an edge termination region arranged between the switchable cells defining the active area and the outer rim, wherein each of the switchable cells comprises a body region, a gate electrode structure and a source region;
a source metallization in ohmic contact with the source regions of the switchable cells; and
a gate metallization in ohmic contact with the gate electrode structures of the switchable cells,
wherein the active area defined by the switchable cells comprises at least a first switchable region having respective channel regions each with a first channel width and at least a second switchable region having respective channel regions each with a second channel width which is different to the first channel width,
wherein the second switchable region is arranged between the gate metallization and the first switchable region,
wherein the second channel width of the channel regions of the second switchable region is smaller than the first channel width of the channel regions of the first switchable region, and
wherein a ratio of the area of the second switchable region to the total area of the switchable regions is in a range from 5% to 50%.

14. The semiconductor device of claim 13, wherein each switchable cell has a given channel width, wherein a first group of switchable cells defines the first switchable region and a second group of switchable cells different to the first group of switchable cells defines the second switchable region.

15. The semiconductor device of claim 13, wherein the channel width of the channel regions changes step-wise from a sub-area of the active area close to the gate metallization to a center of the active area further away from the gate metallization.

16. The semiconductor device of claim 13, wherein the active area defined by the switchable cells further comprises at least a third switchable region having respective channel regions with a third channel width which is different to the first channel width and the second channel width.

17. The semiconductor device of claim 13, wherein the second switchable region forms an outer ring region of the active area and the first switchable region forms a central region of the active area, wherein the outer ring region provides a boundary between the central region of the active area and the edge termination region.

18. The semiconductor device of claim 17, wherein the second switchable cells of the outer ring region have a channel width which is smaller than the channel width of the switchable cells of the central region.

19. The semiconductor device of claim 17, wherein the second switchable cells of the outer ring region have a channel width which is larger than the channel width of the switchable cells of the central region.

20. The semiconductor device of claim 13,
wherein the active area defined by the switchable cells comprises at least the first switchable region, at least the second switchable region, and at least a third switchable region having respective channel regions each with a third channel width which is different to each of the first channel width and second channel width,
wherein the third switchable region is arranged between the gate metallization and the second switchable region,
wherein the third channel width of the channel regions of the third switchable region is smaller than the second channel width of the channel regions of the second switchable region, and
wherein a ratio of the total area of the second and third switchable region to the total area of the first, second and third switchable region is in a range from 5% to 50%.

21. A semiconductor device, comprising:
a semiconductor substrate comprising an outer rim, a plurality of switchable cells defining an active area, and an edge termination region arranged between the switchable cells defining the active area and the outer rim, wherein each of the switchable cells comprises a body region, a gate electrode structure and a source region;
a source metallization in ohmic contact with the source regions of the switchable cells; and
a gate metallization in ohmic contact with the gate electrode structures of the switchable cells,
wherein the active area defined by the switchable cells comprises at least a first switchable region having respective channel regions each with a first channel width and at least a second switchable region having respective channel regions each with a second channel width which is different to the first channel width,
wherein the second switchable region is arranged between the gate metallization and the first switchable region,
wherein the second channel width of the channel regions of the second switchable region is larger than the first channel width of the channel regions of the first switchable region, and
wherein a ratio of the area of the second switchable region to the total area of the switchable regions is in a range from 5% to 50%.

22. The semiconductor device of claim 21,
wherein the active area defined by the switchable cells comprises at least the first switchable region, at least the second switchable region, and at least a third switchable region having respective channel regions each with a third channel width which is different to each of the first channel width and second channel width,
wherein the third switchable region is arranged between the gate metallization and the second switchable region,
wherein the third channel width of the channel regions of the third switchable region is larger than the second channel width of the channel regions of the second switchable region, and
wherein a ratio of the total area of the second and third switchable region to the total area of the first, second and third switchable region is in a range from 5% to 50%.

23. The semiconductor device of claim 21, wherein each switchable cell has a given channel width, wherein a first group of switchable cells defines the first switchable region and a second group of switchable cells different to the first group of switchable cells defines the second switchable region.

24. The semiconductor device of claim 21, wherein the channel width of the channel regions changes step-wise from a sub-area of the active area close to the gate metallization to a center of the active area further away from the gate metallization.

25. The semiconductor device of claim 21, wherein the active area defined by the switchable cells further comprises at least a third switchable region having respective channel regions with a third channel width which is different to the first channel width and the second channel width.

26. The semiconductor device of claim 21, wherein the second switchable region forms an outer ring region of the active area and the first switchable region forms a central region of the active area, wherein the outer ring region provides a boundary between the central region of the active area and the edge termination region.

* * * * *